US008874808B2

(12) United States Patent
Hnatko et al.

(10) Patent No.: US 8,874,808 B2
(45) Date of Patent: Oct. 28, 2014

(54) HIERARCHICAL BUFFER SYSTEM ENABLING PRECISE DATA DELIVERY THROUGH AN ASYNCHRONOUS BOUNDARY

(75) Inventors: Steven J. Hnatko, Fishkill, NY (US); Gary A. Van Huben, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/352,913

(22) Filed: Jan. 18, 2012

(65) Prior Publication Data

US 2012/0124251 A1  May 17, 2012

Related U.S. Application Data

(63) Continuation-in-part of application No. 12/876,512, filed on Sep. 7, 2010, now Pat. No. 8,635,390.

(51) Int. Cl.
| G06F 3/00 | (2006.01) |
| G06F 5/00 | (2006.01) |
| G06F 15/16 | (2006.01) |
| G11C 7/10 | (2006.01) |
| G06F 13/28 | (2006.01) |

(52) U.S. Cl.
CPC .............. *G11C 7/1075* (2013.01); *G06F 13/28* (2013.01); *G11C 7/106* (2013.01); *G11C 7/1087* (2013.01)
USPC ................. 710/53; 710/52; 710/60; 709/233; 711/5

(58) Field of Classification Search
None
See application file for complete search history.

(56) References Cited

U.S. PATENT DOCUMENTS

| 5,867,509 | A  | * | 2/1999  | Tanaka .......................... 714/758 |
| 6,721,796 | B1 | * | 4/2004  | Wong ............................ 709/232 |
| 7,110,423 | B1 | * | 9/2006  | Sethuram et al. ............. 370/519 |
| 7,134,035 | B2 | * | 11/2006 | Sharma et al. ................ 713/500 |
| 7,383,336 | B2 |   | 6/2008  | Strait et al. |
| 7,600,034 | B2 | * | 10/2009 | Nasu et al. .................... 709/232 |
| 7,680,153 | B2 | * | 3/2010  | Ma ................................ 370/503 |
| 7,684,326 | B2 |   | 3/2010  | Nation et al. |
| 8,392,661 | B1 | * | 3/2013  | Metcalf ......................... 711/133 |

(Continued)

OTHER PUBLICATIONS

Method for dynamic management of lazy and eager memory buffers. Disclosed Anonymously (Mar. 2005). pp. 1-3. IP.com No. IPCOM000109216D.

(Continued)

*Primary Examiner* — Michael Sun
(74) *Attorney, Agent, or Firm* — Stachler Intellectual Property Law LLC

(57) ABSTRACT

The present invention provides a system and method for controlling data entries in a hierarchical buffer system. The system includes an integrated circuit device with a memory core, a high speed upstream data bus, and a plurality of 1st tier buffers that receive data from the memory. The system further includes a $2^{nd}$ tier transfer buffer spanning a plurality of asynchronous timing domains that delivers the data onto the upstream data bus to minimize gaps in a data transfer. The method includes managing the buffers to allow data to flow from a plurality of 1st tier buffers through a 2nd tier transfer buffer, and delivering the data onto a high speed data bus with pre-determined timing in a manner which minimizes latency to the extent that the returning read data beats are always transmitted contiguously with no intervening gaps.

18 Claims, 10 Drawing Sheets

(56) References Cited

U.S. PATENT DOCUMENTS

| | | | |
|---|---|---|---|
| 8,572,353 B1* | 10/2013 | Bratt et al. | 712/16 |
| 2001/0009547 A1* | 7/2001 | Jinzaki et al. | 370/390 |
| 2002/0083299 A1 | 6/2002 | Van Huben et al. | |
| 2002/0174316 A1 | 11/2002 | Dale et al. | |
| 2004/0024945 A1* | 2/2004 | Keller et al. | 710/305 |
| 2004/0057447 A1* | 3/2004 | Fukunaga et al. | 370/412 |
| 2004/0202174 A1* | 10/2004 | Kim et al. | 370/395.1 |
| 2006/0126770 A1 | 6/2006 | Yamazaki | |
| 2007/0081562 A1* | 4/2007 | Ma | 370/516 |
| 2008/0133868 A1 | 6/2008 | Glew | |
| 2008/0232179 A1 | 9/2008 | Kwak | |
| 2009/0010162 A1 | 1/2009 | Bergamasco et al. | |
| 2010/0005206 A1 | 1/2010 | Hnatko et al. | |
| 2010/0281230 A1 | 11/2010 | Rabii et al. | |
| 2010/0306477 A1 | 12/2010 | Luttrell | |

OTHER PUBLICATIONS

Method for hierarchical data prefetching on a memory hierarchy. Disclosed Anonymously (Jun. 2004). pp. 1-4. IP.com No. IPCOM000029127D.

* cited by examiner

| DQ BYTES 181 | DDR FREQ (GHZ) 182 | INP CLK (GHZ) 183 | DDR BW (GB/SEC) 184 | MIN FIFO WIDTH 185 | GEAR RATIO 186 | LL BW (GHZ) 187 | LL BYTES 188 | OUT CLK (GHZ) 189 | HSS UI 190 | HSS FREQ (GHZ) 191 | HSS BYTES 192 | HSS BW (GB/SEC) 193 |
|---|---|---|---|---|---|---|---|---|---|---|---|---|
| 4 | 1.600 | 0.8 | 6.4 | 2 | 3 | 19.2 | 8 | 2.4 | 4 | 9.6 | 2 | 19.2 |
| 8 | 1.600 | 1.6 | 12.8 | 1 | 1.5 | 19.2 | 8 | 2.4 | 4 | 9.6 | 2 | 19.2 |
| 4 | 1.600 | 0.8 | 6.4 | 2 | 3.13 | 20 | 8 | 2.5 | 4 | 10 | 2 | 20 |
| 4 | 1.600 | 0.4 | 6.4 | 4 | 3.13 | 20 | 16 | 1.25 | 8 | 10 | 2 | 20 |
| 8 | 1.600 | 0.8 | 12.8 | 2 | 1.56 | 20 | 16 | 1.25 | 8 | 10 | 2 | 20 |
| 4 | 1.866 | 0.47 | 7.46 | 4 | 2.68 | 20 | 16 | 1.25 | 8 | 10 | 2 | 20 |
| 8 | 1.866 | 0.93 | 14.93 | 2 | 1.34 | 20 | 16 | 1.25 | 8 | 10 | 2 | 20 |
| 4 | 2.133 | 0.53 | 8.53 | 4 | 2.34 | 20 | 16 | 1.25 | 8 | 10 | 2 | 20 |
| 8 | 2.133 | 1.07 | 17.06 | 2 | 1.17 | 20 | 16 | 1.25 | 8 | 10 | 2 | 20 |
| 4 | 2.667 | 0.67 | 10.67 | 4 | 1.87 | 20 | 16 | 1.25 | 8 | 10 | 2 | 20 |
| 8 | 2.667 | 1.33 | 21.33 | 2 | 0.94 | 20 | 16 | 1.25 | 8 | 10 | 2 | 20 |

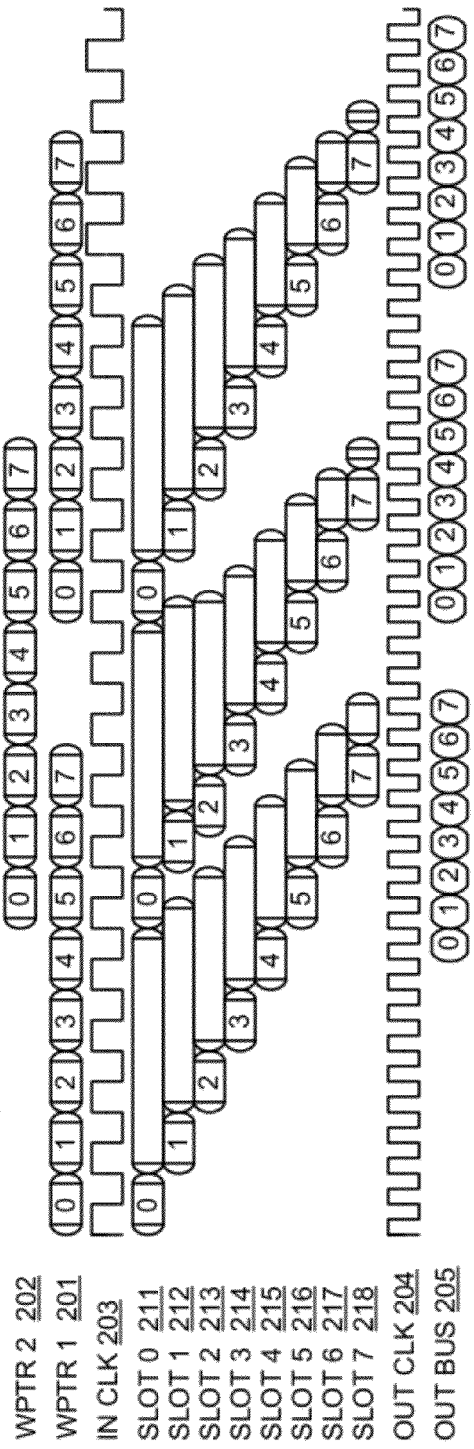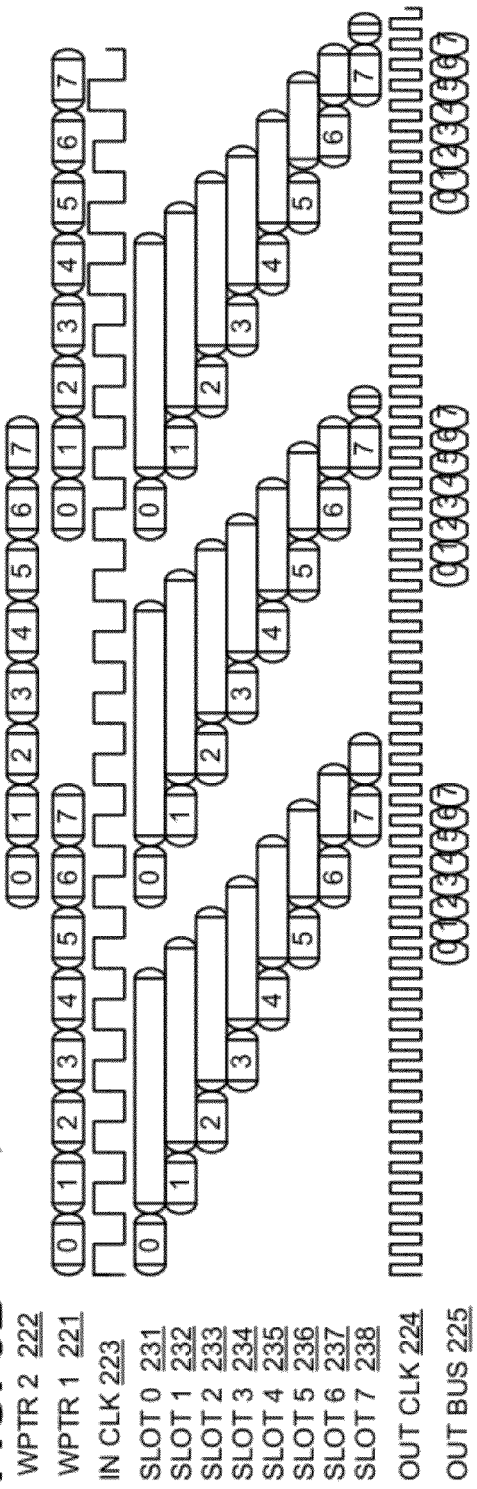

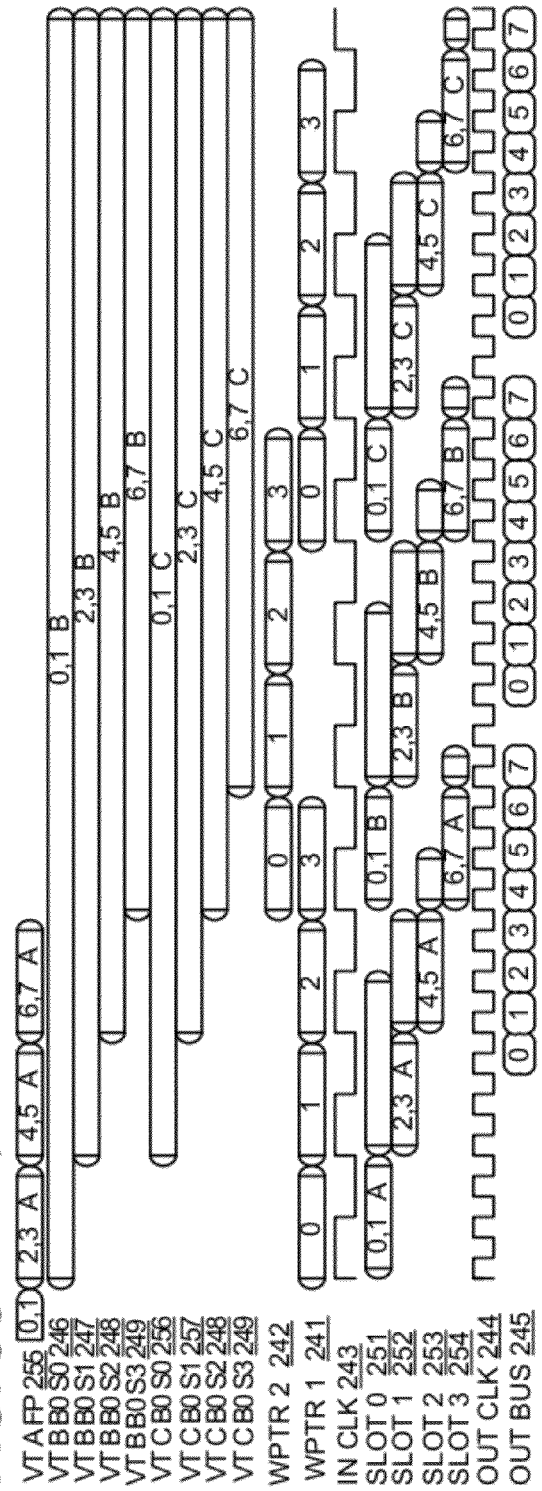
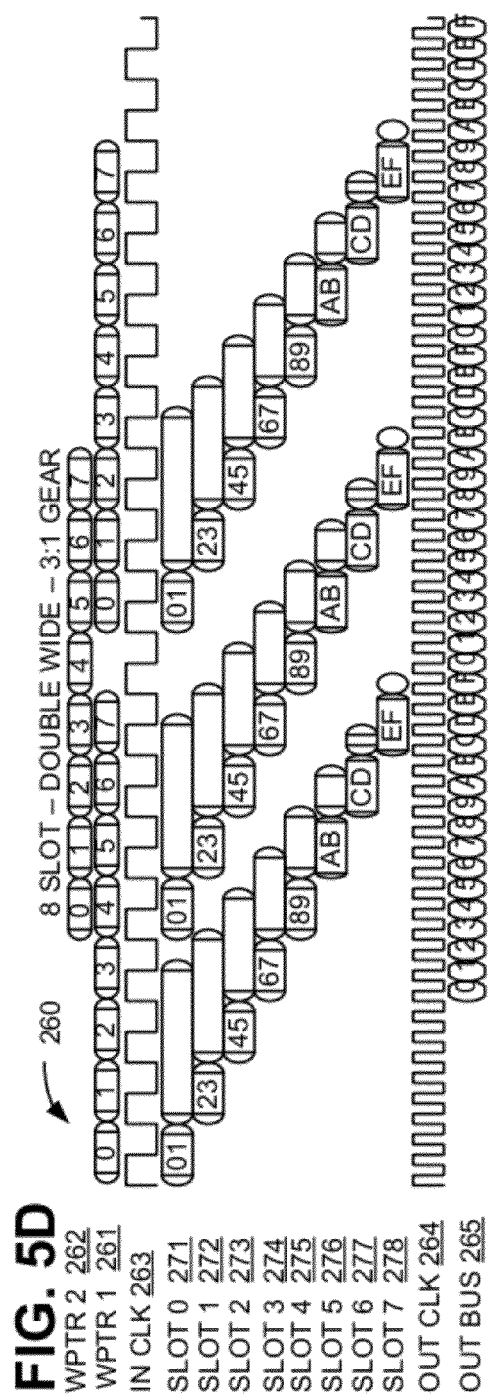

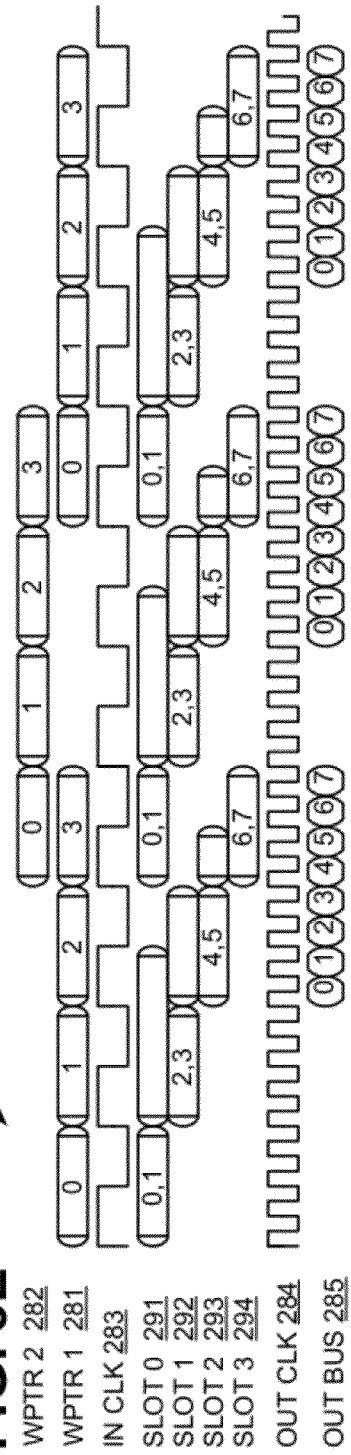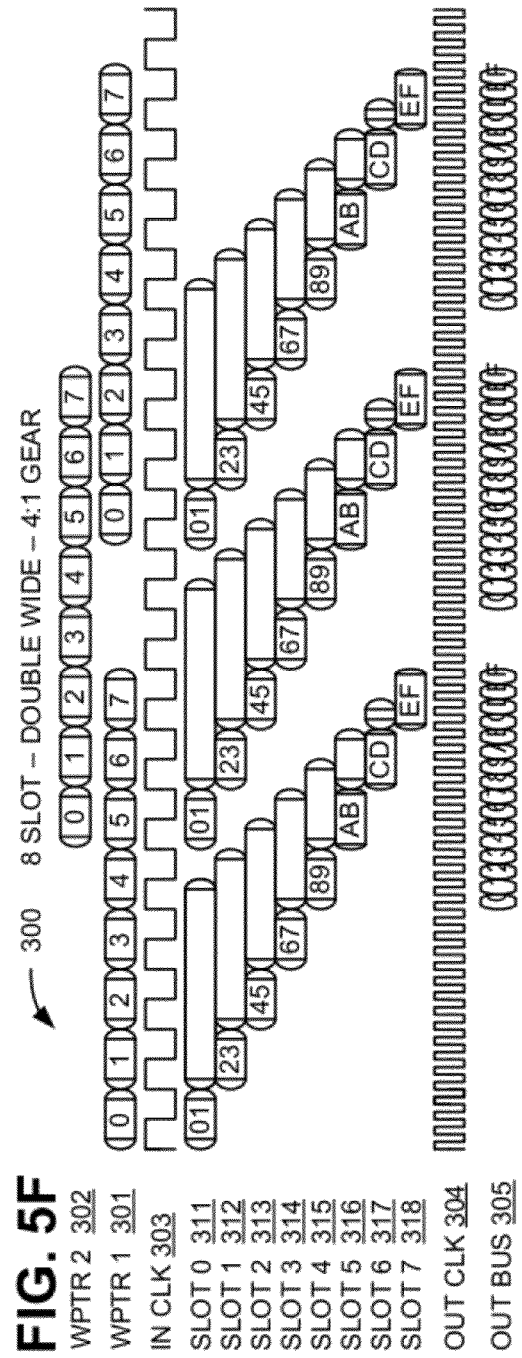

HIERARCHICAL BUFFER SYSTEM ENABLING PRECISE DATA DELIVERY THROUGH AN ASYNCHRONOUS BOUNDARY

CROSS-REFERENCE TO RELATED APPLICATION

This application claims priority to and is a continuation-in-part of U.S. patent application Ser. No. 12/876,512 with a Filing Date of Sep. 7, 2010, entitled "SYSTEM AND METHOD FOR A HIERARCHICAL BUFFER SYSTEM FOR A SHARED DATA BUS", which is incorporated by reference herein in its entirety.

BACKGROUND OF THE INVENTION

1. Field of the Invention

The present invention generally relates to controlling moving data entries in a hierarchical buffer system.

2. Description of Background

Currently, modern computer systems typically contain several integrated circuits (ICs), including a processor which may be used to process information in the computer system. The data processed by a processor may include computer instructions which are executed by the processor as well as data which is manipulated by the processor using the computer instructions. The computer instructions and data are typically stored in a main memory in the computer system.

Processors typically process instructions by executing the instruction in a series of small steps. In some cases, to increase the number of instructions being processed by the processor (and therefore increase the speed of the processor), the processor may be pipelined. Pipelining refers to providing separate stages in a processor where each stage performs one or more of the small steps necessary to execute an instruction. In some cases, the pipeline (in addition to other circuitry) may be placed in a portion of the processor referred to as the processor core. Some processors may have multiple processor cores, and in some cases, each processor core may have multiple pipelines. Where a processor core has multiple pipelines, groups of instructions (referred to as issue groups) may be issued to the multiple pipelines in parallel and executed by each of the pipelines in parallel.

As the number of processing cores increases, it places more demand on the memory subsystem to deliver the required bandwidth of data. Since there is a practical limit to the number of channels a processor can directly attach to memory devices, a common architectural solution involves one or more memory buffer chips present on the channel. A primary role of the buffer chip is to forward a stream of read operations from a plurality of ranks and banks, attached to one or more memory ports, and buffer the returning read data for transmission back to the processor cores. Often the DRAM frequency differs from the memory channel frequency, and this necessitates buffering and speed matching of the returning data.

As the number of read buffers increase, along with the operating frequency of the buffer chip itself, a new problem emerges. The multiplicative product of the number of data bursts with the number of outstanding read requests, results in the number of data sources which needs to be multiplexed onto the memory channel. For example, a buffer chip with 4 read buffers, each capable of holding a burst length 8 (i.e. BL8) DRAM read, results in 32 bursts of data which must be delivered to the memory channel. With channel frequencies surpassing 2 GHz, the buffer data flow now exceeds 1.5 GHz cycle times.

Furthermore, high performance processors are capable of generating continuous read streams which require the buffer chip to support some number of outstanding reads greater than the actual number of physical read buffers. For instance, if the buffer chip has 4 read buffers, the sophisticated scheduling schemes employed by the memory controller will typically launch a 5th read before the 1st read departs the buffer chip. This exploits the known fixed latencies in the memory channel, buffer chip and DRAM devices to pipeline additional read operations and stress the buffers.

The simplest (i.e. brute force) solution is to overdesign the buffer chip data flow and instantiate additional buffers. By using simple round robin schemes, the buffer management logic is easy to implement, but at a physical design cost of additional real estate. This creates a huge problem if the data sources are scattered around the chip. This would necessitate adding pipelining stages just to transport the data either to or from the buffer pool. This approach would also aggravates the problem of having to select from all of the data sources by introducing even more sources into the data flow muxing.

The more common approach is to only employ the required number of buffers (4 in this example), but to use a more sophisticated buffer controller which supports pipelining. As data is being read out of the first buffer, the returning DRAM data from the 5th read simultaneously begins loading into the first buffer. Then the returning data from a 6th read can pipeline into the second buffer and so on. This solution permits the memory controller to send a continuous read stream, and depending on the ratio of the DRAM frequency to the channel frequency, a sustained bandwidth of twice the number of actual read buffers can typically be achieved. However, the problem of outgating 32 sources still remains. With data flows running at 1-2 GHz, this often requires additional pipelining stages between the buffer pool and the memory channel. Unfortunately, this method impacts the latency of the start of data delivery.

SUMMARY OF THE INVENTION

Embodiments of the present invention provide a system and method for controlling data entries in a hierarchical buffer system. Briefly described, in architecture, one embodiment of the system, among others, can be implemented as follows.

The system includes an integrated circuit device comprising: a memory core, a high speed upstream data bus and a plurality of 1st tier buffers that receive data from the memory. The system further includes a 2nd tier transfer buffer that delivers the data onto the upstream data bus with pre-determined timing.

Embodiments of the present invention can also be viewed as providing methods for controlling data entries in a hierarchical buffer system. In this regard, one embodiment of such a method, among others, can be broadly summarized by the following steps. The method includes managing buffers to allow data to flow from a plurality of $1^{st}$ tier buffers through a $2^{nd}$ tier transfer buffer, and calculating precise delivery times for the data in the $2^{nd}$ tier transfer buffer to minimize gap in a data transfer. The method further includes enabling the $2^{nd}$ tier transfer buffer to serve as an asynchronous boundary to permit data to cross a plurality of clock domains running at different frequencies, and delivering the data in the $2^{nd}$ tier transfer buffer onto an upstream data bus, and wherein said data is delivered at the calculated precise delivery times.

Embodiments of the present invention can also be viewed a processor device for controlling data entries in a hierarchical buffer system. The processor device comprising: a memory core containing data, a high speed upstream data bus. The processor device further includes circuitry configured to: manage buffers to allow the data to flow from a plurality of $1^{st}$ tier buffers through a $2^{nd}$ tier transfer buffer spanning a plurality of asynchronous timing domains, and delivere the data from the $2^{nd}$ tier transfer buffer onto the high speed upstream data bus to minimize gaps in a data transfer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the embodiment of the present invention is particularly pointed out and distinctly claimed in the claims at the conclusion of the specification. The foregoing and other objects, features, and advantages of the invention are apparent from the following detailed description taken in conjunction with the accompanying drawings in which:

Figure 1A:
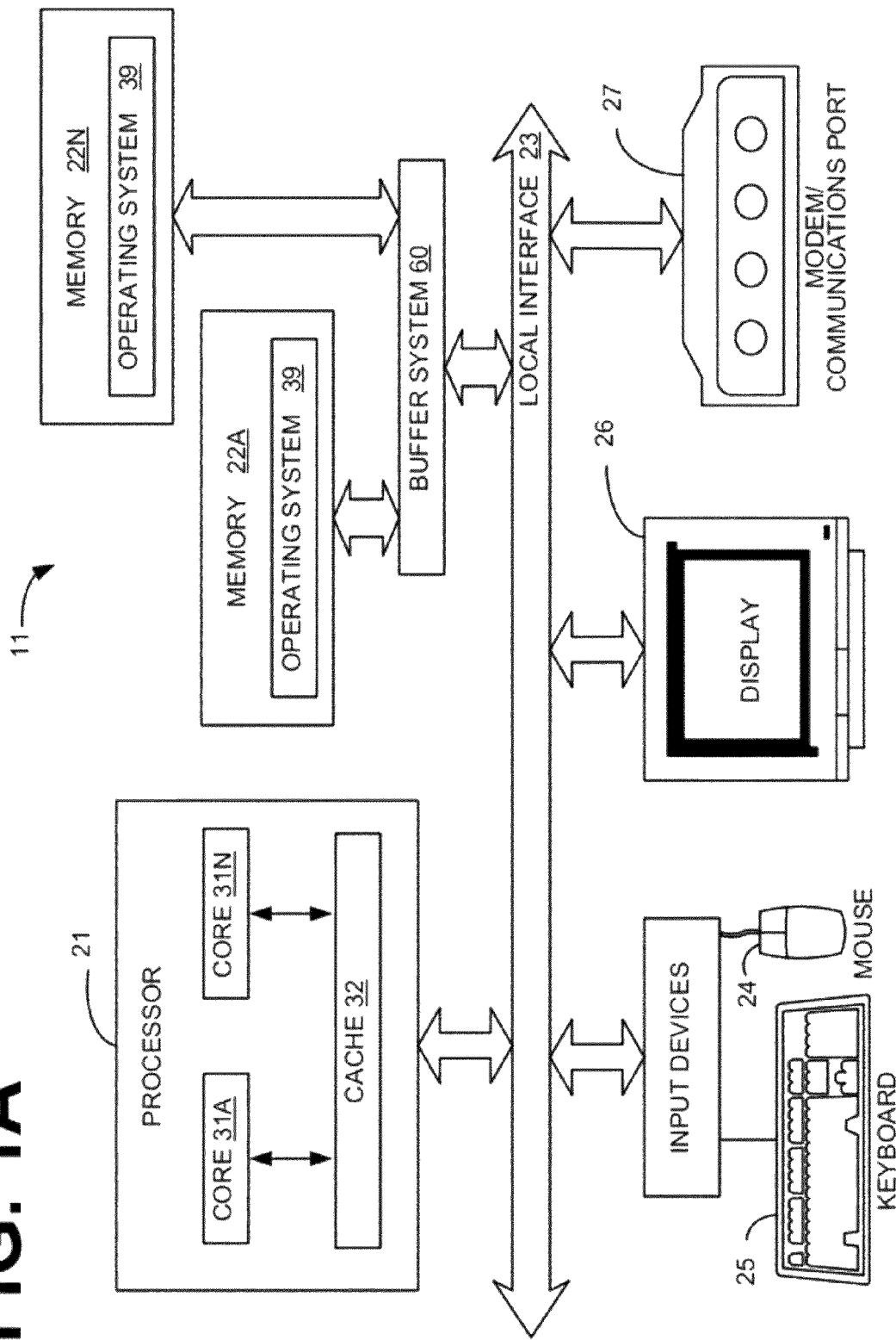
FIG. 1A is a block diagram depicting a system utilizing the hierarchical buffer system of one embodiment of the invention.

The example table in FIG. 4 is a table illustrating an example that explains the timing diagrams examples illustrated in FIG. 5A-F, and to show the key variables that drive the hierarchical buffer system according to one embodiment of the invention.

FIGS. 5A-F are timing diagrams depicting examples is of the operation of a hierarchical buffer system.

The detailed description explains the preferred embodiments of the invention, together with advantages and features, by way of example with reference to the drawings.

DETAILED DESCRIPTION OF THE INVENTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether a particular advantage is achieved by a given embodiment is not limiting of the invention. Thus, the following aspects, features, embodiments and advantages are merely illustrative and are not considered elements or limitations of the appended claims except where explicitly recited in the claim(s). Likewise, reference to "the invention" shall not be construed as a generalization of any inventive subject matter disclosed herein and shall not be considered to be an element or limitation of the appended claims except where explicitly recited in a claim(s).

One embodiment of the present invention addresses problems identified above in the backgroud by employing a cascaded buffer structure wherein the $1^{st}$ tier comprises three buffers, while the second tier holds the fourth buffer. A sophisticated buffer controller supports two levels of data pipelining. The first level entails data movement from one of the three holding buffers to the second tier transfer buffer. The second level of pipelining occurs within a given buffer to allow data associated with one transaction to begin unloading while data for a second transaction simultaneously loads into the buffer. This approach reduces the final outgoing multiplexer or mux to a maximum of 8 sources for a burst length 8 read operation, and further reduces the number of required pipelining stages to transmit the data on the channel.

In order to match the sustained bandwidth of a traditional design employing the traditional parallel buffer pool, another embodiment of the present invention further contemplates a flow controller which forwards data bursts from the $1^{st}$ tier of holding buffers to the second tier transfer buffer in advance of their scheduled time slice on the memory channel. Therefore, in cases where multiple reads are issued in close succession, the one embodiment of the present invention incorporates a read transfer buffer which also acts as a speed matching buffer to ensure the data for subsequent read transactions returns in a gapless fashion, having 16 or 32 buffers that need to funnel down to some output channel, the traditional approach would be to try to clump them together to have any hope of closing timing. However, this creates a huge problem if the data sources are scattered around the chip.

One embodiment of the present invention comprises an innovative read transfer buffer which dynamically transforms between a traditional first-in first-out buffer (i.e. FIFO or queue), a dual write port single read port FIFO buffer and a simple staging register. This structure allows for a minimal latency initial data transfer when no buffering is required, as well as a minimum latency impact when buffering is required. In memory intensive applications, it's imperative to minimize the latency on demand fetch requests as that requested data could stall the process if not delivered in a timely fashion. But of equal or possibly more importance is the requirement for gapless data transfers. Processors typically fetch entire cache lines worth of memory data in a given read transaction. This can result in 64 HSS Unit Intervals (or beats) of data encapsulated in complex ECC protection schemes. The processor can't process the data until an ECC check is performed. The multi-stage pipelining becomes increasingly difficult and hinders performance if the data can't be reconstituted on consecutive cycles. In some situations a protocol that permits the initial data burst to be transmitted with low latency, but includes gaps between subsequent data bursts detracts from overall system performance more than one that incurs a higher initial latency penalty in exchange for a gapless transfer of the entire cache line. Our invention provides a method to ensure the latter.

Figure 1B:
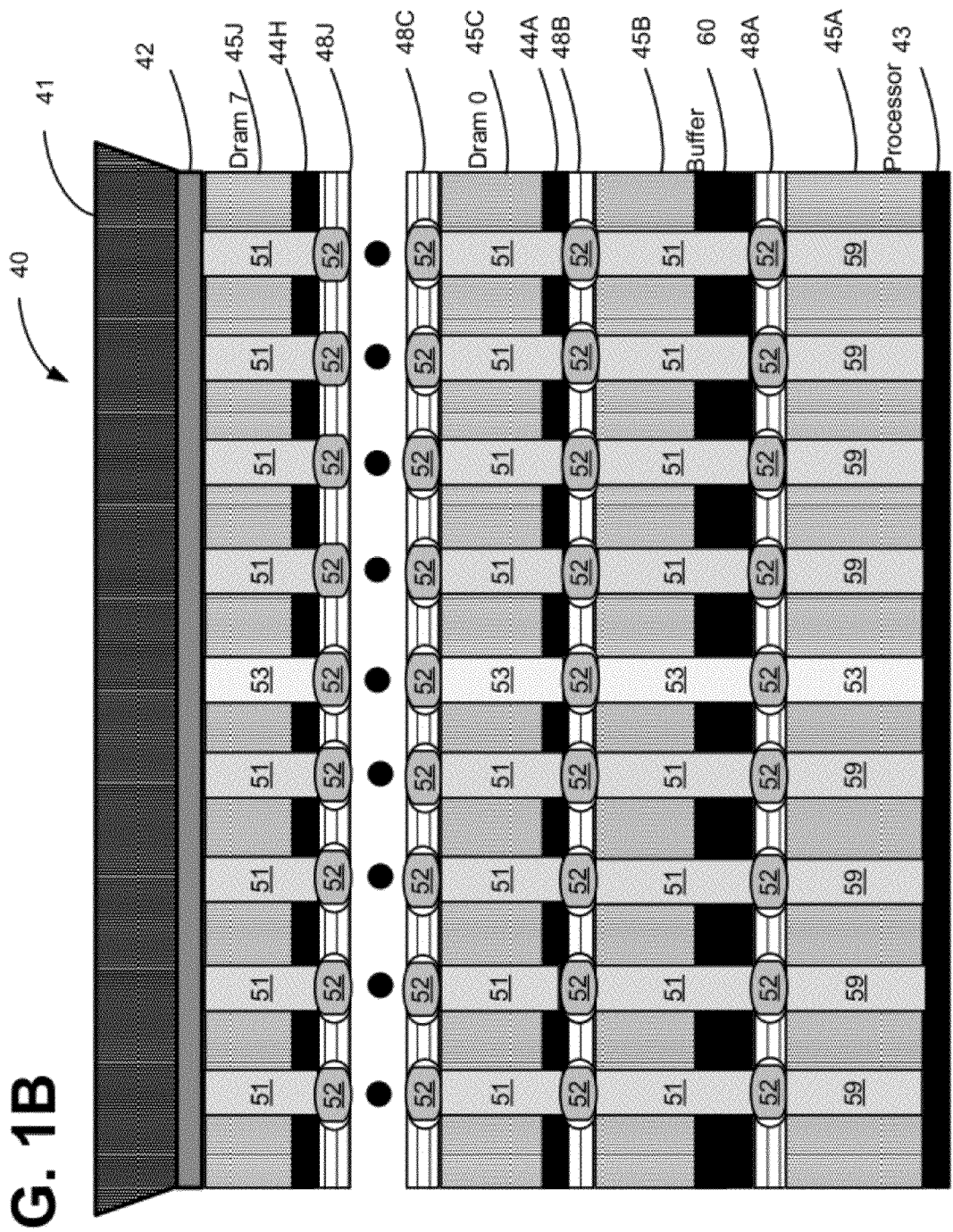
FIG. 1B is a cross section block diagram illustrating an example of the C4 or flip chip connection channels in an exemplary chip stack utilizing the hierarchical buffer system in another embodiment of the invention.

The preferred embodiment contemplates a hybrid memory cube architecture wherein memory is stacked vertically as shown in FIG. 1B but is divided into vaults. Each vault shown in vault box 80 of FIG. 2A operates independently and comprises a self sufficient memory controller. The memory controller accepts read requests from a processor, or requesting engine, and accumulates them for scheduling and execution. The memory controller is responsible for managing the banks within the DRAMs and adhering to the operational timing rules associated with DRAM accesses. This also includes scheduling the required refreshes among the read and write accesses. One skilled in the art will appreciate the myriad of art related to optimizing and scheduling memory controller accesses of DRAMs. Our invention contemplates interfacing with any memory controller embodiment as part of the vaults in FIG. 2A.

However, there is also the underlying aspect of floor planning. The aims of an optimal floor plan are a total chip area which is as small as possible and short delay times, (i.e. short connecting wires between the cells). Again when considering an example, having 16 or 32 buffers that need to funnel down to some output channel, the traditional approach would be to try to clump them together to have any hope of closing timing. However, this creates a huge problem if the data sources are scattered around the chip. This would necessitate adding pipelining stages just to transport the data either to or from the buffer pool. Every transfer incurs that extra latency, even transactions that sat in a buffer for many cycles waiting for their turn on the output channel.

The tiered structure of one embodiment of the present invention enables the optimization of the floorplan for a circuit. Consider having those 32 $1^{st}$ tier buffers organized as 4 pools of 8 buffers wherein each pool is located near a corner of a chip. Now, funnel the 4 pools to two $2^{nd}$ tier buffers each of which may be located at a midpoint in the path. Finally, the two $2^{nd}$ tier buffers can get multiplexed or muxed down to a single $3^{rd}$ tier buffer which is located at the output channel. This essentially hides the chip propagation delay as part of the reload manager moving data in the background. One embodiment of the present invention is a way to minimize the impact of the buffers on a critical path so that one can focus propagation delay efforts on the low-latency (fast) path.

Embodiments of the invention may be utilized with and are described below with respect to a system, e.g., a computer system. As used herein, a system may include any system utilizing a processor and a memory, including a mainframe, server, personal computer, internet appliance, digital media appliance, portable digital assistant (PDA), portable music/video player and video game console, cell phone or tablet computer. While memories may be located on the same die as the processor which utilizes the memory, in some cases, the processor and memories may be located on different dies (e.g., separate chips within separate modules or separate chips within a single module). Alternative embodiments of the invention may be utilized with network routing, graphic card memory management, cache hierarchy and the like.

While described below with respect to a processor having multiple memories, wherein each processor core uses multiple pipelines to execute instructions, embodiments of the invention may be utilized with any processor which utilizes a memory, including processors which have a single processing core. In general, embodiments of the invention may be utilized with any memory and are not limited to any specific configuration.

FIG. 1A is a block diagram illustrating an example of a computer 11 utilizing one embodiment of the present invention for a hierarchical buffer system. Computer 11 includes, but is not limited to, mainframes, servers, PCs, workstations, laptops, PDAs, palm devices and the like. Generally, in terms of hardware architecture, as shown in FIG. 1, the computer 11 include a processor 21, memory 22, and one or more input and/or output (I/O) devices (or peripherals) that are communicatively coupled via a local interface 23. The local interface 23 can be, for example but not limited to, one or more buses or other wired or wireless connections, as is known in the art. The local interface 23 may have additional elements, which are omitted for simplicity, such as controllers, buffers (caches), drivers, repeaters and receivers, to enable communications. Further, the local interface 23 may include address, control and/or data connections to enable appropriate communications among the aforementioned components.

The processor 21 is a hardware device for executing software that can be stored in memory 22. To provide for faster access to data and instructions, as well as better utilization of the processor 21, the processor may have multiple processor cores 31. The processor 21 may retrieve data from memory 22 through local interface 23.

The processor 21 can be virtually any custom made or commercially available processor, a central processing unit (CPU), data signal processor (DSP) or an auxiliary processor among several processors associated with the computer 11, and a semiconductor based microprocessor (in the form of a microchip) or a macroprocessor. Examples of suitable commercially available microprocessors are as follows: a PowerPC or Cell BE microprocessor or Z-Series processors from IBM, U.S.A., an 80x 86 or Pentium series microprocessor from Intel Corporation, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A. The memory elements 22(A-N) may be replicated. In one embodiment, the memory elements 22(A-N) interface with a memory buffer chip comprising the buffer management facilities in the hierarchical buffer system 60 of the present invention. The memory buffer chips can be configured in a daisy chain topology wherein every memory transaction is forwarded through each memory buffer chip and the returning memory read data shares a single upstream data path which also passes through each memory buffer chip. This topology allows for easy memory expansion by connecting additional 2-port memory buffer chips in a daisy-chained fashion.

The memory 22 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), flash, programmable read only memory (PROM), tape, compact disc read only memory (CD-ROM), disk, diskette, cartridge, cassette or the like, etc.). Moreover, the memory 22 may incorporate electronic, magnetic, optical, and/or other types of storage media. Note that the memory 22 can have a distributed architecture of memory elements 22(A-N), where various components are situated remote from one another, but can be accessed by the processor 21.

An alternate embodiment is also contemplated wherein a plurality of memory elements 22(A-N) is directly attached to the local interface 23 with the hierarchical buffer system 60. The hierarchical buffer system 60 employs the concept of Read Data Buffer Delay to schedule the precise timing of each returning data transaction and manage the memory data transactions from a plurality of memory elements 22(A-N) in a distributed fashion. The hierarchical buffer system 60 of the present invention requires no explicit communication between the hierarchical buffer systems 60 contained within the plurality of memory elements 22(A-N).

The software in memory 22(A-N) may include one or more separate programs, each of which comprises an ordered listing of executable instructions for implementing logical functions. In the example illustrated in FIG. 1A, the software in the memory 22(A-N) includes a suitable operating system (O/S) 39. The operating system 39 essentially controls the execution of other computer programs, and provides scheduling, input-output control, file and data management, memory management, and communication control and related services.

A non-exhaustive list of examples of suitable commercially available operating systems 39 is as follows (a) a Windows operating system available from Microsoft Corporation; (b) a Netware operating system available from Novell, Inc.; (c) a Macintosh operating system available from Apple Computer, Inc.; (e) a UNIX operating system, which is available for purchase from many vendors, such as the Hewlett-Packard Company, Sun Microsystems, Inc., and AT&T Corporation; (d) a Linux operating system, which is freeware that is readily available on the Internet; (e) z/OS™ or z/VM™ operating systems available from IBM Corporation; (f) a run time Vxworks operating system from WindRiver Systems, Inc.; or (g) an appliance-based operating system, such as that implemented in handheld computers or personal data assistants (PDAs) (e.g., Symbian OS available from Symbian, Inc., PalmOS available from Palm Computing, Inc., and Windows CE available from Microsoft Corporation).

The I/O devices may include input devices, for example but not limited to, a mouse 24, keyboard 25, scanner (not shown), microphone (not shown), etc. Furthermore, the I/O devices may also include output devices, for example but not limited to, a printer (not shown), display 26, etc. Finally, the I/O devices may further include devices that communicate both inputs and outputs, for instance but not limited to, a NIC or modulator/demodulator 27 (for accessing remote devices, other files, devices, systems, or a network), a radio frequency (RF) or other transceiver (not shown), a telephonic interface (not shown), a bridge (not shown), a router (not shown), etc.

If the computer 11 is a PC, workstation, intelligent device or the like, the software in the memory 22 may further include a basic input output system (BIOS) (omitted for simplicity). The BIOS is a set of essential software routines that initialize and test hardware at startup, start the operating system 39, and support the transfer of data among the hardware devices. The BIOS is stored in some type of read-only-memory, such as ROM, PROM, EPROM, EEPROM or the like, so that the BIOS can be executed when the computer 11 is activated.

When the computer 11 is in operation, the processor 21 is configured to execute software stored within the memory 22, to communicate data to and from the memory 22, and to generally control operations of the computer 11 are pursuant to the software. The operating system 39 and any other program are read, in whole or in part, by the processor 21, perhaps buffered within the processor 21, and then executed.

FIG. 1B is a cross section block diagram illustrating an example of the C4 or flip chip connection channels in a exemplary chip stack 40 utilizing the hierarchical buffer system 60 in another embodiment of the invention.

The exemplary chip stack 40 comprises a multitude of chips 45 (A-J) that further include one or more electrically conductive channels 51 and/or thermal conductive channel 53, which extend through a chip 45 from the top surface to the bottom surface. In one embodiment, the "conductive channel" is really a combination of two or more thru-silicon-vias (TSVs) connected sequentially by one or more controlled collapse chip connection.

Preferably, the electrically conductive channels 51 are formed of tungsten or copper; however, other conductive materials may be used and are contemplated. The electrically conductive channels 51 selectively conduct electrical signals to and from portions of the circuitry 43 and 44 thereon or simply couple to solder bumps 52 to interconnect differing chips 45 (e.g., chips 45A-45J) in the chip stack 40, or both. The solder bumps 52 are located within an area of a thermal interface material (TIM) pad 48. In one embodiment, the area is punched out of the TIM pad 48. In another embodiment, the area is formed during the creation of the TIM pad 48.

The TIM pad 48 comprises a phase change material (PCM) or a silicone grease. Preferably, the thermal conductive channel 53 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channel 53 use micronized or pulverized silver. Another type of thermal conductive channel 53 are the phase-change materials. The phase change materials are solid at room temperature, but liquefy and behave like grease at operating temperatures. The thermal conductive channel 53 conduct heat to and from portions of the circuitry 43, 60 and 44(A-H) thereon. The thermal conductive channel 53 couple to solder bumps 52 to interconnect differing chips 45A-45J in the chip stack 40 (e.g., chips 45A-45J), couple to heat sink 41 through thermal grease 42 or TIM pad 48, that conducts the heat to the side of the chip stack 40.

The electrically conductive channels 51 couple to solder bumps 52 on a bond pad (not shown) on the bottom surface of chip 45 (A-J). The solder bumps 52 are electrically isolated from the chip 45 and one another according to conventional practice. In addition, the electrically conductive channels 51 are preferably electrically insulated from the chip 45 by insulating regions (not shown) which are disposed between the electrically conductive channels 51 and the chip 45. The insulating regions preferably are silicon dioxide ($SiO_2$); however, other insulating materials may be employed and are contemplated as falling within the scope of the present invention. The insulating regions prevent the signals being transmitted in the electrically conductive channels 51 from disturbing the bias voltage of the chip 45 (which is typically either a ground potential or a Vdd). Of course, in some cases, one of the terminals of the circuitry 43, 44 and 60 on the top surface may be held at a substrate potential, in which case, the appropriate electrically conductive channel 51 may be non-insulated and thus be in electrical contact with the chip 45 being held at a similar potential, as may be desired.

As shown, each chip 45(A-J) uses electrically conductive channels 51 in a controlled, collapse chip connection (C4) structure (also often called solder bump or flip-chip bonding). The illustrated example chip stack 40 includes a chip 45A with microprocessor capabilities, chips 45B includes the hierarchical buffer system 60 circuitry. Solder bumps 52 are then placed on a bond pad (not shown) for the electrically conductive channels 51 of a second (or top) chip 45A, which is oriented face-down (i.e., flip-chip), aligned and brought into contact with the electrically conductive channels 51. Electrical interconnections between the electrically conductive channels 51 are formed by heating the solder bumps 52 to a reflow temperature, at which point the solder flows. After the solder flows, subsequent cooling results in a fixed, electrically conductive joint to be formed between the electrically conductive channels 51.

The electrically conductive channels 51 are utilized as the data transmission channels between the circuitry 44 (A-H) (i.e. dram memory) and the processor circuitry 43 utilizing the hierarchical buffer system 60.

The base chip 45J on one side is attached to a heat sink 41 with thermal grease 42. Other chips 45A-45I can have C4 connection structures implemented on both the top surface and bottom surface thereof, as illustrated in FIG. 1B. In such instances, a second chip 45I may similarly be oriented face-down with respect to the base chip 45J and coupled thereto-using solder bumps 52.

The C4 structure of FIG. 1B overcomes one disadvantage of the connection methodologies. Initially, because the ball-bonding attachment technique is avoided, significantly less stress is placed on the solder bump 52 during connection, which allows circuitry 44 (A-J) and 60 to be formed under the solder bump 52. The circuitry 44 (A-J) is formed according to any one of many conventional semiconductor processing techniques. The heat is brought to the edges of the chip stack 40 through the thermal conductive channel 53 and TIM pad 48. Once the heat is brought to the edges of the chip stack 40, multiple heat sinks or other type devices may be utilized to more efficiently dissipate that heat of the chip stack 40.

Figure 2A:
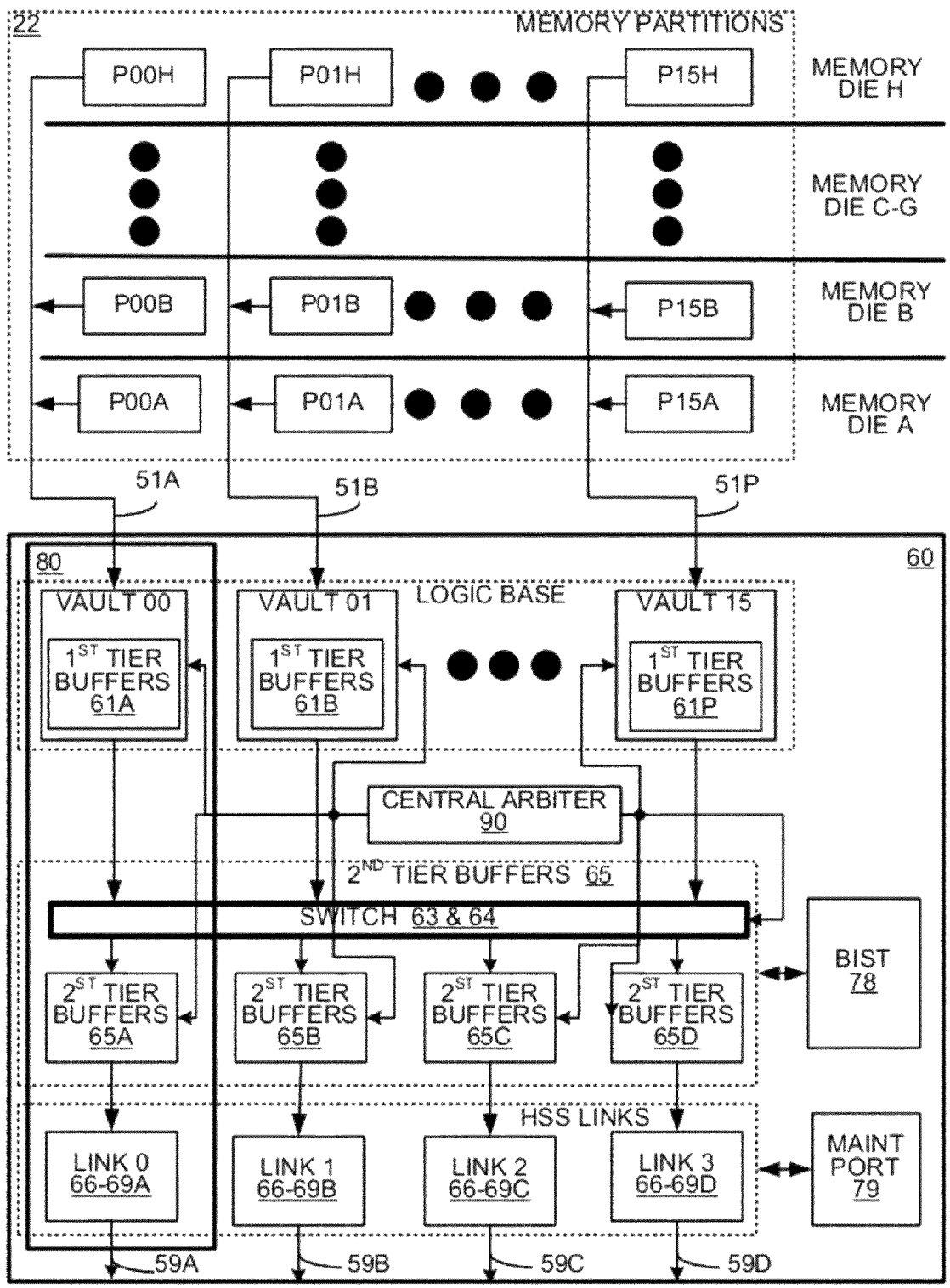
FIG. 2A is a block diagram depicting an example of the arrangement of buffer controllers in the hierarchical buffer system according to one embodiment of the invention.

FIG. 2A is a block diagram depicting an example of the arrangement of a central arbiter 90 in the hierarchical buffer system 60 according to one embodiment of the invention. The first tier data buffers 61/fast path staging registers 62 are contained within each vault 80 and are used for data storage within that vault 80 alone. The second tier transfer buffers 65 are assigned to a particular HSS link 59. In this embodiment, the central arbiter 90 plays a more significant role vs. single HSS channel applications. The role of the central arbiter 90 is to calculate read data buffer delay on the fly and deploy the read data buffer delay finite state machines 91 (A-D) to manage vault data delay onto the HSS data link (i.e. channels) 59. Each read data buffer delay finite state machine 91 (A-D) is associated with a single $1^{st}$ tier data buffer 61(A-C) in each vault 80. Since each vault 80 can drive data to any HSS link 59, care must be taken to ensure data collisions between vaults 80 do not occur. The central arbiter 90 performs this function by monitoring all read commands issued by each vault 80 and calculating the channel utilization for each HSS link 59. The present invention contemplates various means by which a read command can convey information pertaining to the target memory bank, the burst length, and the destination HSS link 59. This information is passed from the memory controller within each vault 80 to the central arbiter 90 upon scheduling and executing the read. The central arbiter 90 can then allocate read data buffer delay or assign the data to the fast path staging register 62 for each vault's 80 read data transactions to ensure no data collisions occur between vaults 80 targeting the same HSS link 59. In the event of simultaneous commands received by the central arbiter 90 for the same HSS link, priority can be permanently assigned to a particular vault 80 or other arbitration schemes, such as, but not limited to, round robin, least recently used, or LFSR-based can also be used to assign the HSS link 59 channel slots.

Due to the need to ensure gapless data transfers along the HSS links 59, all data transactions are assigned at a minimum a read data buffer delay delay value equal to the idle cycle time and a buffer layover time calculated for the particular gear ratio, fifo structure, and data burst length in use. This min read data buffer delay count will be transferred to the block finite state machine 93(A-C) (along with additional possible delay) when the read data buffer delay finite state machines transfer the data to the 2nd tier transfer buffers and assign control to the BLK finite state machines. Aside from the minimum delay time, (idle+layover) additional read data buffer delay buffer delay may be required if the HSS link 59 targeted by the transaction will be occupied when the vault's 80 data is returned. This additional delay is added to the precalculated min delay for the total read data buffer delay buffer delay.

When a read data buffer delay finite state machine 91(A-D) is deployed within a vault 80 it's destination HSS link 59 ID is transferred to the read data buffer delay finite state machine 91(A-D) so that upon buffer delay expiration (i.e. delay reaches threshold at which it must transfer read data to $2^{nd}$ tier transfer buffers 65) control may be handed off to the appropriate link's block finite state machine 93(A-C) and data loaded into the corresponding link's $2^{nd}$ tier transfer buffer 65. Again, any remaining buffer delay residue, including but not limited to the idle cycle time and layover, is spent in the $2^{nd}$ tier transfer buffer 65. In situations where a non-zero idle/layover time is required, even fast path staging register 62 data transactions will be delayed in the $2^{nd}$ tier transfer buffer 65 by the amount equal to that time. The block finite state machines 93(A-C) are associated with a particular HSS link 59 and may be deployed by the read data buffer delay finite state machine 91(A-D) of any vault 80.

Like the traditional applications, data may be transferred from the vault 80 $1^{st}$ tier data buffer 61(A-C) into the vault 80 $2^{nd}$ tier transfer buffer 65 early using the $2^{nd}$ tier transfer buffer 65 additional write port. Again, this minimizes the gaps between successive transactions on the HSS link 59 by permitting the loading of the next transaction into the $2^{nd}$ tier transfer buffer 65 while the first transaction is also still loading/unloading. Aside from better utilization of the HSS links' 59 available bandwidth the $2^{nd}$ tier transfer buffer's 65 dual port loading allows the system to minimize time data resides within the 1st tier data buffer 61(A-C), freeing them up for future transactions. The early unload is coordinated by the reload manager 94 which monitors the unloading of the $2^{nd}$ tier transfer buffers 65 and signals the next in line vault's 80 read data buffer delay finite state machines 91(A-C) to initiate the unload of the $1^{st}$ tier data buffer 61(A-C) down to it's HSS link 59 potentially before it's internal timers would have triggered the $1^{st}$ tier data buffer 61(A-C) unload.

The hierarchical buffer system 60 of the present invention also supports the grouping of vaults 80 (A-D) to form larger logical structures. For example, 2 or more vaults 80 may be tied together to run in sync with one another. In such arrangements, the $1^{st}$ tier data buffer 61(A-C) will be managed by a single vault's read data buffer delay finite state machines 91 (A-D) and manage the delay/unloading of a plurality of vault's 80 data to the targeted HSS link 59. The hierarchical buffer system 60 will otherwise operate in the same fashion as above except for the $2^{nd}$ tier transfer buffers 65 loading data from multiple vaults 80 simultaneously on the same port.

Figure 2B:
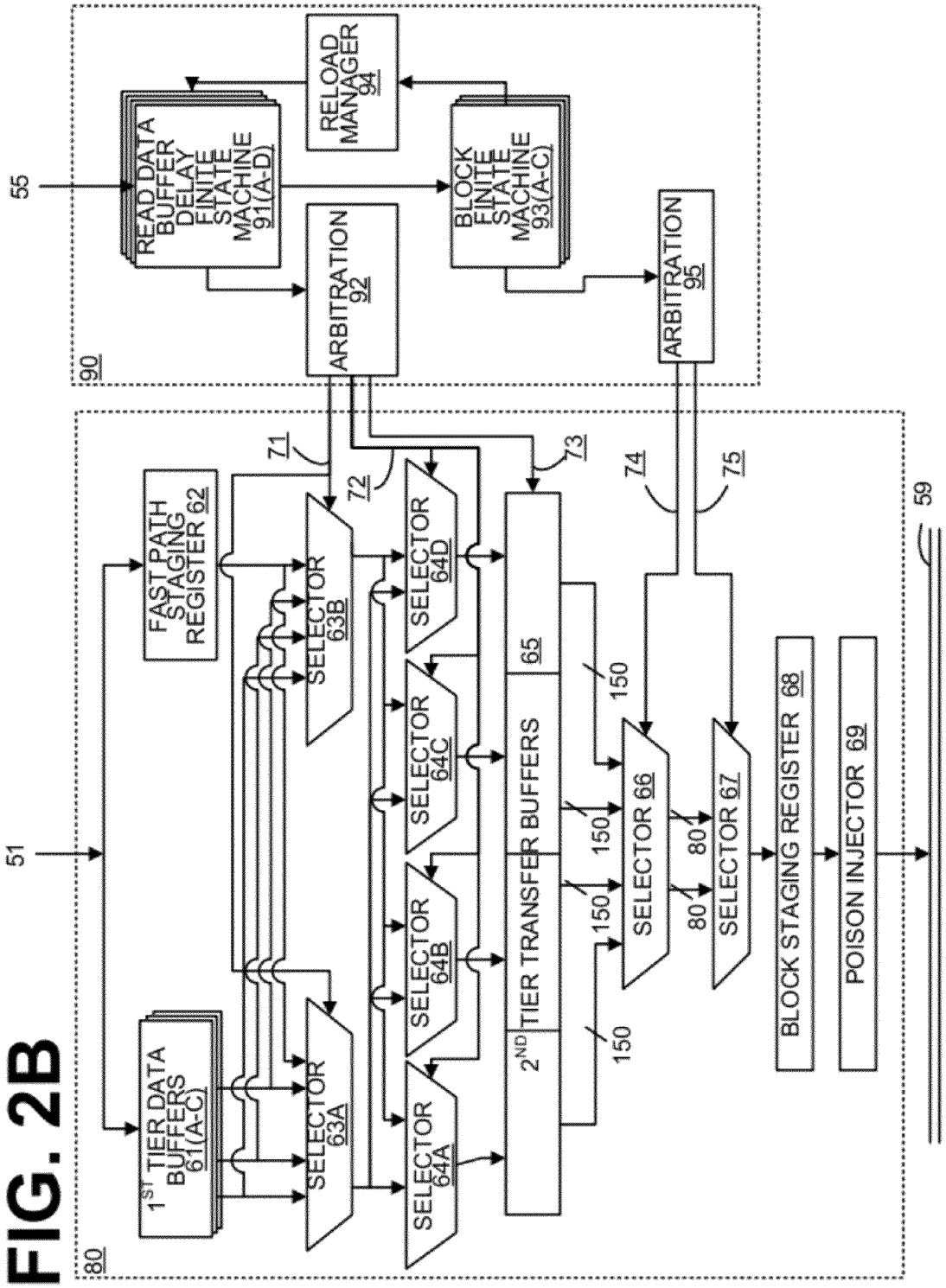
FIG. 2B is a block diagram depicting an example of the architecture of one channel in the hierarchical buffer system according to one embodiment of the invention.

FIG. 2B is a block diagram depicting an example of the architecture of one vault 80 in the hierarchical buffer system 60 according to one embodiment of the invention. For simplicity, FIG. 2B depicts and is described with respect to a hierarchical buffer system 60, memory 22 (A-N.) and the local interface 23. In one alternative embodiment, the hierarchical buffer system 60 is positioned between the cache memory 32 and a single processor core 31 of the processor 21. In still another alternative embodiment, the hierarchical buffer system 60 is positioned between the DRAM 44 (A-H) and a circuitry 43. In one embodiment, each processor core 31 may be identical (e.g., contain identical hierarchical buffer systems 60). In another embodiment, each processor core 31 may share a single hierarchical buffer system 60.

The movement of data from the $1^{st}$ tier data buffers 61(*a-c*) onto a HSS link 59 (i.e. local interface 23) is though the $2^{nd}$ tier transfer buffer 65. In the preferred embodiment, HSS link 59 could be any data bus. HSS link 59 can be just a high speed data bus back to any unit requesting data such as, but not limited to, a high speed serial link. The unit requesting data can be for example but not limited to, a processor unit, another storage unit, a peripheral and the like. The movement of data is managed by a number of control finite state machines working together. The $1^{st}$ tier data buffers 61(*a-c*) are controlled by the read data buffer delay finite state machine 91(*a-c*), which manages the unloading of read data from the $1^{st}$ tier data buffers 61(*a-c*) into the $2^{nd}$ tier transfer buffer 65 using hierarchical selectors 63(*a-b*) and selectors 64(*a-d*). In the illustrated example implementation, three read data buffer delay finite state machines 91(*a-c*) are utilized, one for each physical $1^{st}$ tier data buffer 61(*a-c*) and a fourth read data buffer delay finite state machine 91*d*. The fourth read data buffer delay finite state machine 91*d* manages the read data traffic into the $2^{nd}$ tier transfer buffer 65 in situations where the read data circumvents the $1^{st}$ tier data buffers 61(*a-c*) and is loaded directly into the $2^{nd}$ tier transfer buffer 65 from the fast path staging register 62. This "flush" path will be described below.

The three read data buffer delay finite state machines 91(*a-c*) are each tied to a specific $1^{st}$ tier data buffer 61(*a-c*) and control unloading data from that $1^{st}$ tier data buffer 61(*a-c*). The control of unloading data from that $1^{st}$ tier data buffer 61(*a-c*) into the $2^{nd}$ tier transfer buffer 65, is provided by controller signals 71 and 72 from arbitration block 92 for hierarchical selectors 63(*a-b*) and selectors 64(*a-d*), respectively. The control of loading data to the $2^{nd}$ tier transfer buffer 65 is provided by signal 73. In the preferred embodiment, arbitration block 92 just OR's the control signals from each read data buffer delay finite state machines 91(*a-c*) together to form the control signals out to the hierarchical selectors 63(*a-b*), selectors 64 (*a-d*), and $2^{nd}$ tier transfer buffer 65. In the preferred embodiment, there is no priority built into one read data buffer delay finite state machines 91 (A-D) controls vs. another. However, in alternative embodiments, a priority is added to read data buffer delay finite state machines 91 (A-D) for additional protections. The arbitration block 92 also performs error detection functions to prevent read data buffer delay finite state machines 91(*a-c*) from trying to load data to the same $2^{nd}$ tier transfer buffer 65 slot simultaneously, thereby creating data collisions.

In the preferred embodiment, read data buffer delay finite state machines 91(*a-d*) operate at the DRAM clock frequency and manage delays in DRAM clock increments. The read data buffer delay finite state machines 91(*a-d*) operate such that they can simultaneously unload data to the $2^{nd}$ tier transfer buffer 65 as a new read data transfer is loaded into the available $1^{st}$ tier data buffer 61(*a-c*). In the preferred embodiment, this is accomplished by utilizing a queue system within each read data buffer delay finite state machine 91(*a-c*) to track the current and future buffer wait time and data burst length of each read data transfer in the $1^{st}$ tier data buffer 61(*a-c*). The queues are used because multiple read requests can be issued to the system before the data for the $1^{st}$ request is received. The read data buffer delay finite state machines 91(*a-d*) store the information for the subsequent requests while it is waiting to process or processing the first request. For example, the scheduler within a vault 80 may issue two consecutive read requests to two different banks. However, the inherent internal DRAM latency must be accounted for by the read data buffer delay finite state machine queues as part of managing the loading of the $1^{st}$ tier buffers. One skilled in the art can envision how DRAM timing parameters such as memory frequencies, CAS latency, tFAW, tRRD, tCCD, refresh timings, precharge timings and the like are determined during the power on initialization sequence, and wherein this information can be made readily available to the various components within the hierarchical buffer system 60 that require said information. When the first request is completed, the next request is acquired from the front of the queue, if it exists.

Once the data is unloaded from a $1^{st}$ tier data buffer 61(*a-c*) or fast path staging register 62, control is passed from the read data buffer delay finite state machines 91(*a-d*) to one of three data block controllers (i.e. block finite state machines 93(*a-c*)) which manage the data within the $2^{nd}$ tier transfer buffer 65 and control the serialization of data to the block staging register 68. The block finite state machines 93(*a-c*), like the read data buffer delay finite state machines 91(*a-d*), are capable of managing the read data buffer delay while the data is in the $2^{nd}$ tier transfer buffer 65 and unloading the data onto the HSS link 59 at a specific time to ensure gapless transfers and prevent data collisions on the shared channel between selector 66 and selector 67. This not only prevents collisions between selector 66 and 67, but the use of the read data buffer delay finite state machines 91(*a-d*) also prevent collisions on the shared bus between a plurality of buffer controllers, for example between multiple memory buffer chips. The arbitration 95 is managed by the block finite state machines 93(*a-c*) and control's selector 66 and selector 67. The number of block finite state machines 93(*a-c*) in use is related to the number of $1^{st}$ tier data buffers 61(*a-c*) implemented. In the illustrated example, three block finite state machines 93(*a-c*) operate in a round-robin fashion and are not tied to a specific $1^{st}$ tier data buffer 61(*a-c*). Each of the three block finite state machines 93(*a-c*) can independently control the serialization of data from the $2^{nd}$ tier transfer buffer 65 onto the HSS link 59. As such, care must be taken to detect and avoid collisions when unloading from the three 1st tier data buffers 61(*a-c*) into the $2^{nd}$ tier transfer buffer 65. The read data buffer delay finite state machines 91(*a-d*) can for a given transaction, pass coordination signals to the data block controllers (i.e. block finite state machines 93(*a-c*) to detect and avoid collisions between the $2^{nd}$ tier transfer buffer 65 and block staging register 68.

The data in the block staging register 68 is then moved through the poison injector 69 before being deposited on the HSS link 59. In the event of an error situation, the hierarchical buffer system 60 uses a special cyclic redundancy code (CRC) to communicate back to the host that a malfunction has occurred and the requested read data is not forthcoming. This permits the host to attempt a recovery procedure such as reissuing the failed read command or alerting the operating system to deallocate memory space and redirect future reads to other physical memory locations. In the preferred embodiment, the hierarchical buffer system 60 employs an 80 bit wide data block on the HSS link 59. Two consecutive 80 bit blocks represent a single frame. Of those 160 bits, 144 are actual memory data while the remaining 16 are used for a cyclic redundancy code (CRC). CRC is well known in the art, and there are numerous codes that can be applied to protect a 144 bit transmission. The preferred embodiment employs a code that is able to detect any single solid lane failure, and any random bit flips within the frame, up to 4 bits. An 80 bit block of all zeros is considered a valid idle pattern. By alternatively inverting the first and last bits of the two 80 bit blocks within a frame, this creates a poison CRC code. A poison CRC is a special pattern such that if a transmission error occurs, the bit flip will result in a true CRC error. Thus, the poison CRC code can be used as a message to indicate to the host that a problem has occurred, and the read command was unable to be successfully processed.

The hierarchical buffer system 60 employs a poison injector 69 with corresponding facilities that monitor error indicators within the hierarchical buffer system 60. Upon detection of error indicators, the poison injector 69 intercepts any pending transfers from the block staging register 68 and overlays the existing 80 bit data pattern with the poison CRC pattern. Furthermore, the hierarchical buffer system 60 contains frame boundary detection logic which ensures the poison injection always begins at the start of a new frame. The CRC code employed in one embodiment is such that a random data pattern in the first 80 bit block, followed by a poison CRC pattern in the second 80 bit block, has a statistical chance of producing 160 bits of data which appear to be valid data with good CRC. In order to prevent any possibility from the host being misled into believing the received frame contains valid data, the hierarchical buffer system 60 will allow a frame that's in the middle of a transfer to complete. At the next frame boundary, the poison injector 69 will overlay the poison pattern and alert the unit requesting data to the malfunction. The preferred embodiment employs a system-wide recovery policy which allows for a command retry queue of sufficient depth to permit the poison injector 69 to wait for the next frame boundary to insert the poison CRC pattern.

The use of the block finite state machines 93($a$-$c$) allows for various clock ratios (i.e. gear ratios) to be used between the DRAM data loading into the $1^{st}$ tier data buffers 61($a$-$c$), $2^{nd}$ tier transfer buffer 65 and the unloading from the $2^{nd}$ tier transfer buffer 65 onto the HSS link 59. In the preferred embodiment, the block finite state machines 93($a$-$c$) operate at a higher clock frequency than the read data buffer delay finite state machines 91($a$-$d$) and allow for sub-DRAM clock cycle read buffer delay to be used to provide gapless transitions between independent read data transfers.

The third controller used in the data transfer is the reload manager 94, which is responsible for monitoring the $2^{nd}$ tier transfer buffer 65 and signaling to the read data buffer delay finite state machines 91($a$-$d$) that the $2^{nd}$ tier transfer buffer 65 has become available for use and may be loaded with data from the $1^{st}$ tier data buffer 61($a$-$c$). This "early" unload allows the $1^{st}$ tier data buffer 61($a$-$c$) to be freed up as soon as possible for subsequent data and ensures the $2^{nd}$ tier transfer buffer 65 is fully utilized. To aid in the tracking of individual read data operations through the data flow, and to prevent the unloading of $1^{st}$ tier data buffers 61($a$-$c$) in the incorrect order, each read data transfer is assigned an id. The reload manager 94 tracks which read ids have been unloaded and which are the next to unload from each $1^{st}$ tier data buffer 61. When the read data buffer delay finite state machine 91 transfers control to the block finite state machines 93($a$-$c$), this ID is also transferred. When the block finite state machines 93($a$-$c$) signal the reload manager 94 that the $2^{nd}$ tier transfer buffer is unloaded, the transfer id is communicated as part of this signaling so that the reload manager 94 can update its information on which is the next transfer id that should be moved into the $2^{nd}$ tier transfer buffer 65, and signal the correct read data buffer delay finite state machines 91 (A-D) accordingly.

In one embodiment of the invention, a fast path staging register 62 is shown to close timing. In a preferred embodiment, the fast path staging register 62 is a staging register. In an alternative embodiment, the system and method providing a hierarchical buffer system 60 operate efficiently if the fast path staging register 62 is missing and data goes straight from the source (i.e. appropriate electrically conductive channel 51) to the $2^{nd}$ tier transfer buffer 65. In still another alternative embodiment, the system and method providing a hierarchical buffer system 60 utilize multiple fast path staging registers 62 in order to close timing.

To unload the $1^{st}$ tier data buffers 61($a$-$c$) early, the hierarchical buffer system 60 utilize a reload manager 94. The reload manager 94 entity actively manages the flow of the data from the $1^{st}$ tier data buffers 61($a$-$c$) to the $2^{nd}$ tier transfer buffer 65 to ensure the data is ready in the $2^{nd}$ tier transfer buffer 65 when its turn comes to go out on the HSS link 59. This is a key differentiator from prior art which would typically operate in one of three ways depending on the data structure: (a) simply let the data sit in the $1^{st}$ tier data buffers 61($a$-$c$) until the delay expires (reaches 0). This is called passive buffer pipelining because even if room is available in the $2^{nd}$ tier transfer buffer 65, it still waits around until the delay expires before data moves. (b) Wait until the $2^{nd}$ tier transfer buffer 65 empties and then move the data from the $1^{st}$ tier data buffers 61($a$-$c$) to the $2^{nd}$ tier transfer buffer 65. This method does not rely on a delay timer at all. This can't work in an architecture that has a required delivery time on the data. It can only be used in environments where the data either moves asynchronously or in a structure like the prior art. In other words, one time the $2^{nd}$ tier transfer buffer 65 might free up in 5 cycles and then the data moves from the $1^{st}$ tier data buffers 61($a$-$c$). However, the next time, it might take 50 cycles to free up, but the system architecture doesn't care about that variable time, it just requires that things are done in order. (c) Use a combination of (a) and (b) to try to move the data to the $2^{nd}$ tier transfer buffer 65 early if the $2^{nd}$ tier transfer buffer 65 empties prior to the delay expiring, but if it doesn't, then revert back to a passive mode of operation and just wait until the delay expires. The problem with this is depending on the sequence of reads, and their associated transfer lengths, there would be cases where it fails to adhere to the gapless transfer rule which states that once data has been buffered, and begin transmitting back to the host, the transmission of all remaining data would be gapless and occur on the correct cycle.

Figure 3A:
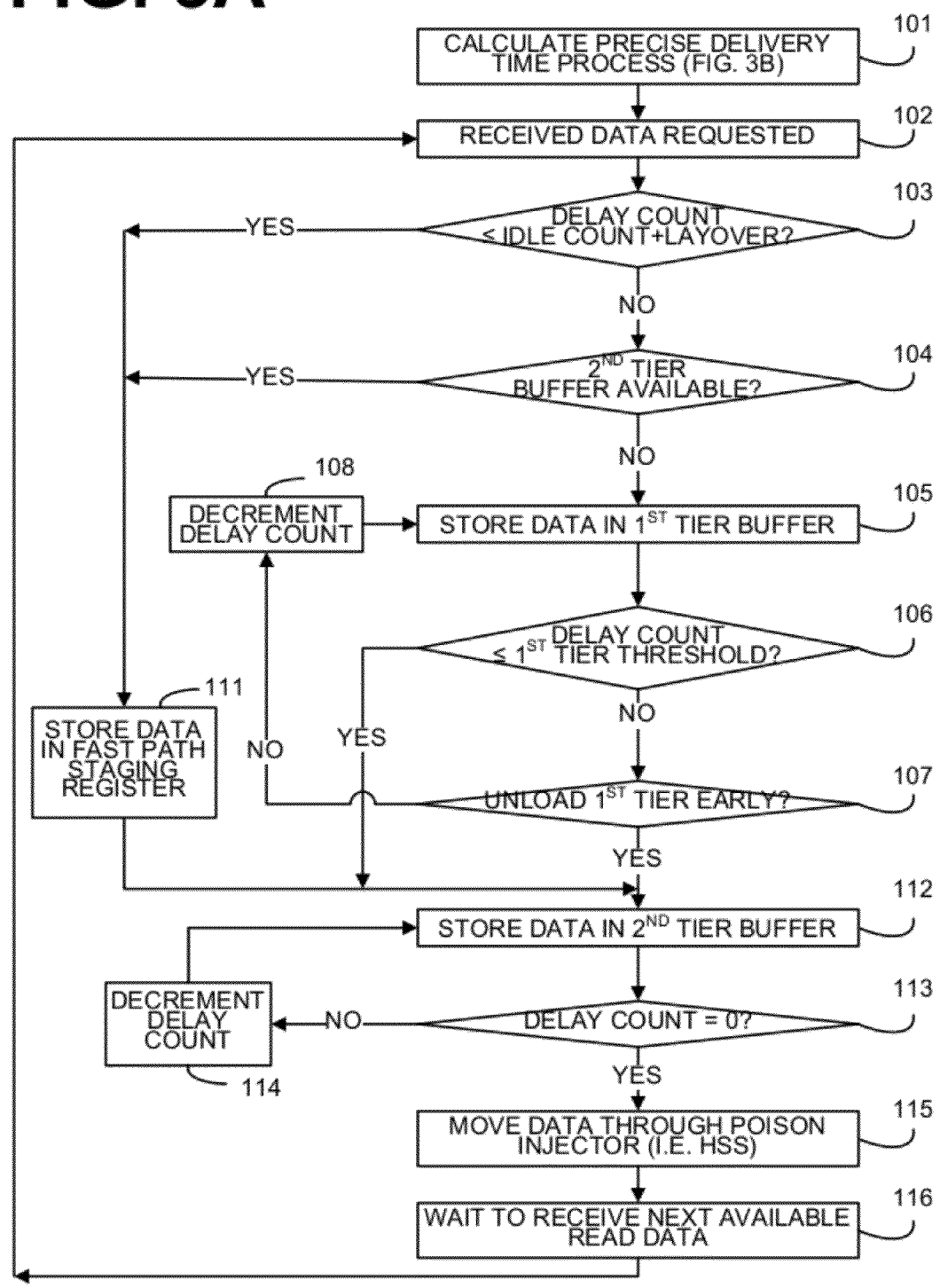
FIG. 3A a flow chart illustrating an example of the operation of a hierarchical buffer system according to one embodiment of the invention.

FIG. 3A a flow chart illustrating an example of the operation 100 of a single vault's 80 data though hierarchical buffer system 60 according to one embodiment of the invention. The flow chart shows the control path for data as it is moved though the buffer hierarchy. The flow chart demonstrates the possible data paths for a single transaction (i.e. burst length 8 or 4) based on the predetermined read delay, buffer availability, and transaction size.

At the start of the transaction, the central arbiter 90 pre-calculates the read data buffer delay, if any, as needed for the vault's 80 data for the targeted HSS link 59 at step 101. The calculation of the read data buffer delay is performed by the calculate precise delivery time process herein defined in further detail with regard to FIG. 3B.

When the vault's 80 data becomes available at step 102, a transaction ID assigned and the read data buffer delay finite state machines 91 (A-D) is deployed and returned read data is transferred either to the $1^{st}$ tier data buffer 61(A-C) for holding, or though the fast path staging register 62, if needed, or directly to the $2^{nd}$ tier transfer buffer 65 for HSS link 59. This is accomplished first at step 103 by determining if the delay count is less than the idle count plus the layover time. If it is determined at step 103 that the delay count is less than the idle count plus the layover time, then the operation 100 stores in the fast path staging register 62 at step 111, and skips to step 112. However, if it is determined at step 103 that the delay count is not less than idle count plus layovers, then the operation 100 determines if the $2^{nd}$ tier transfer buffer 65 is immediately available. If it is determined at step 104 if the $2^{nd}$ tier transfer buffer 65 is immediately available, then the operation 100 stores in the fast path staging register 62 at step 111, and skips to step 112. When the data reaches the $2^{nd}$ tier transfer buffer 65, the block finite state machine 93(A-C) is deployed and any remaining required idle delay is accrued before the data is out gated to the HSS link 59.

If it is determined at step 104 if the $2^{nd}$ tier transfer buffer 65 is not immediately available, then the data will begin to accumulate it's buffer delay in the vault's 80 $1^{st}$ tier data buffer 61(A-C) at step 105. The transfer from the vault's 80 1st tier data buffer 61(A-C) to the $2^{nd}$ tier transfer buffer 65 is initiated in two possible ways. The first way is to determine if sufficient delay has been accumulated in the $1^{st}$ tier data buffer 61(A-C) such that the remaining delay falls below the delay threshold of the $1^{st}$ tier data buffer 61(A-C). This determination is performed at step 106. If it is determined that the remaining delay falls below the delay threshold of the $1^{st}$ tier data buffer 61(A-C), then the operation 100 skips to step 112. This is so the data in the $1^{st}$ tier data buffer 61(A-C) is transferred to the 2nd tier transfer buffer 65 in order to meet the total specified read delay and transmit the data across the HSS link 59 at the precise time. This delay threshold of the $1^{st}$ tier data buffer 61(A-C) is a factor of the gear ratios between the input and output clocks. If it is determined at step 106 that the remaining delay does not fall below the delay threshold of the $1^{st}$ tier data buffer 61(A-C), then it is determined if the $1^{st}$ tier data buffer 61(A-C) may unload early at step 107. This "early" unload may occur before the transaction's delay count has fallen below the $1^{st}$ tier threshold level. Again, any remaining delay will be accumulated in the $2^{nd}$ tier transfer buffer 65. This early unload occurs so as to free up the 1st tier data buffer 61(A-C) for new transactions for that vault 80 and to ensure maximum usage of available space in the $2^{nd}$ tier transfer buffer 65. Due to the dual port loading capability of the $2^{nd}$ tier transfer buffers 65, it is possible to load 2 separate transactions into 2 different $2^{nd}$ tier buffer slots simultaneously if needed. If it is determined at step 107 that the $1^{st}$ tier data buffer 61(A-C) may not unload early, then the delay count is decremented at step 108, and returns to repeat steps 105-107. If it is determined at step 107 that the $1^{st}$ tier data buffer 61(A-C) may unload early, then the operation 100 skips to step 112.

At step 112, the $1^{st}$ tier data buffer 61(A-C) unloads because a $2^{nd}$ tier slot had becomes available to be written to such as when the previous transaction begins it's unload to the HSS link 59 at step 112. In this case, the reload manager 94 will signal to the next scheduled vault's 80 read data buffer delay finite state machines 91 (A-D) to unload it's $1^{st}$ tier data buffer 61(A-C) contents to the $2^{nd}$ tier transfer buffer 65. An example of this is herein defined in further detail with regard to FIG. 5C, which demonstrates a scenario where 3 vaults feed data to a single HSS link 59 utilizing a 4 slot double-wide $2^{nd}$ tier buffer and a load/unload gear ratio of 3:1. The transaction ID assigned at step 102, is used along with the read data delay to ensure transactions are processed in a sequential manner and that the $1^{st}$ tier data buffers 61(a-c) are processed in a round-robin fashion. The reload manager 94 maintains a running tally of the next-to-unload transaction ID to be loaded into the $2^{nd}$ tier transfer buffer 65. When the read data buffer delay finite state machines 91(a-c) unload their data into the $2^{nd}$ tier transfer buffer 65 they indicate the transaction ID to the reload manager 94 so that the reload manager 94 may update its records of what is the next ID to be unloaded from each $1^{st}$ tier data buffers 61(a-c). Each time the block finite state machines 93(a-c) unload the $2^{nd}$ tier transfer buffer 65 they also notify the reload manager 94 as to the ID which was unloaded. This ensures that the transactions are processed sequentially and none are skipped.

At step 113, it is determined if the delay count is equal to zero. If it is determined at step 113 that the delay count is not equal to zero, then the operation 100 decrements the delay count at step 114 and returns to repeat steps 112-113. However, if it is determined at step 113 that the delay count is equal to zero, then the operation 100 skips to step 115.

At step 115, data in the $2^{nd}$ tier transfer buffer 65 is moved through the poison injector 69 onto the HSS link 59. At step 116, the operation 100 waits to receive the next requested data for processor 21/43. After receiving the requested data for processor 21/43, the operation of the operation 100 then returns to repeat steps 102-116.

Figure 3B:
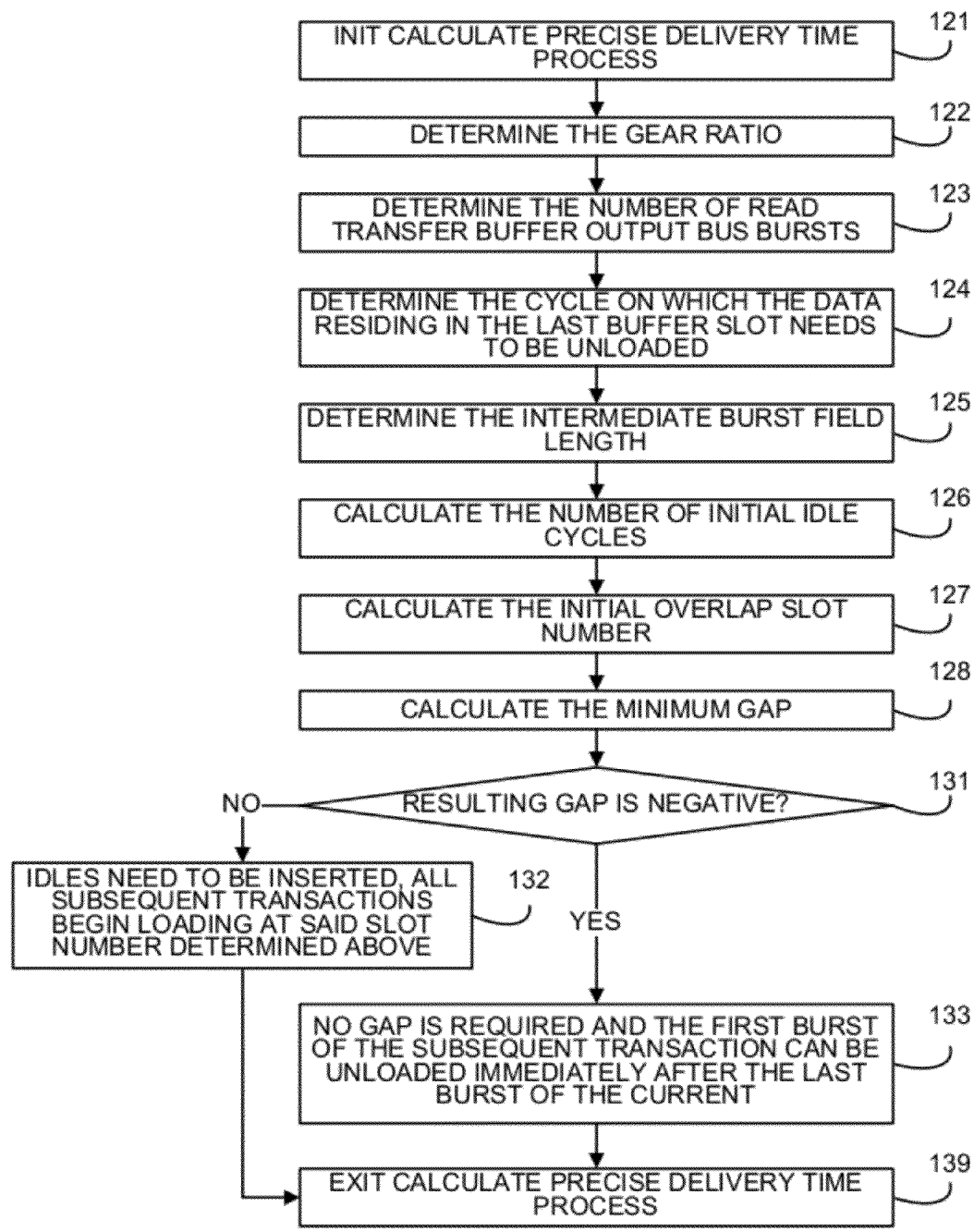
FIG. 3B a flow chart illustrating an example of the operational process to calculate a precise delivery time in the hierarchical buffer system according to one embodiment of the invention.

FIG. 3B a flow chart illustrating an example of the operational process to calculate a precise delivery time 120 in the operation 100 of a single vault's 80 data though hierarchical buffer system 60, according to one embodiment of the invention. The operation 100 of the present invention supports a plurality of High Speed Serial (HSS) link frequencies interfacing with a multitude of memory speeds. This permits a variety of system structures employing different processors driving DRAMs that can be optimized for cost, capacity or performance. The ratio of the read transfer buffer output bus frequency to the buffer's input bus frequency must be determined prior to normal operation. The operational process to calculate a precise delivery time 120 contemplates several ways to accomplish this.

First at step 121, the operational process to calculate a precise delivery time 120 is initialized. This initialization includes the startup routines and processes embedded in the BIOS of the computer 11. The initialization also includes the establishment of data values for particular data structures utilized in the operational process to calculate a precise delivery time 120.

At step 122, the operational process to calculate a precise delivery time 120 determines the appropriate gear ratio for the read data transfers. The most straightforward manner is through firmware programming the gear ratio directly into configuration registers. Even in systems where the memory can be dynamically plugged prior to run time, the system still requires a boot up and initialization process to establish the proper operating frequency, voltage and timings for the DRAMs. Since this process is normally driven by firmware, one can envision how a firmware procedure can easily derive the read transfer buffer input bus frequency. Depending on the system structure and the read transfer buffer FIFO width, the input bus frequency typically matches either the memory clock frequency or the DRAM double data rate frequency. Although these are the common embodiments, the operation 100 of the present invention also supports other less common input bus frequencies such as half of the memory clock frequency. Since this fraction of the DRAM double data rate frequency is designed into the system structure, the firmware procedure only needs to determine the speed of the DRAMs installed at initialization time in order to compute the input bus frequency. Similarly, the output bus frequency is also designed into the system structure based on the characteristics of the HSS link, and therefore is also known at initialization time. Thus, it's a simple matter of dividing the output bus frequency by the input bus frequency. In the event this division doesn't result in an even integer quotient, the result must be rounded up to the next integer. For example, if the result of the division is 3.25, it must be rounded up to 4 to yield a gear ratio of 4:1.

In alternate embodiment, the gear ratio is computed by digital logic using a set of counters. One counter is clocked using the read transfer buffer input bus clock, while the second counter is clocked using the faster read transfer buffer output bus clock. A level sensitive gating signal spans both clock domains and, upon being switched as part of an initialization procedure, allows both counters to begin incrementing. The slower input bus clock counter is designed to hold a maximum count of a power of 2 and automatically freezes upon reaching a pre-determined maximum. For example, a 9 bit counter would freeze upon reaching a value of 256. The most significant bit would drive a level sensitive signal across the clock domains to the faster output bus clock counter. Upon switching, this level sensitive signal would freeze the output bus clock counter. Simple binary division is employed to divide the faster counter by the slower counter and determine the gear ratio. A simple OR of the low order bits of the faster clock counter signifies whether the integer division has a remainder, and thus the gear ratio needs to be incremented. Again, referring to this example, the lower 8 bits of the output bus clock counter would be OR'd together. In the event the clocks are synchronous and the faster clock is a true integer multiple of the slower clock, these 8 bits would be all zero at the time the freeze signal is asserted. Otherwise, a non-zero value in the lower 8 bits indicates either a non-integer multiple or asynchronous behavior between the domains. In either case, by rounding the gear ratio to the next integer, this ensures the output read pointer will not attempt to unload a data burst that has not had sufficient time to set up and hold within the read transfer buffer.

Next, the operational process to calculate a precise delivery time 120 calculates the number of initial idles required on the read transfer buffer output bus prior to unloading the data bursts from the buffer. This ensures the buffer is primed with a sufficient amount of data to guarantee a seamless transfer of data bursts on the HSS link 59. Seamless transfers are a very desirable characteristic since memory data is often ECC protected in addition to applying Cyclic Redundancy Checks (CRC) on the HSS transfers. Thus, the pipelines established on the processor side of the HSS link 59 work more efficiently when the data streams without gaps or interruption. The operation 100 of the present invention ensures data is transferred seamlessly even when memory read operations occur after long periods of inactivity.

In order to calculate the number of initial idles required on the read transfer buffer output bus prior to unloading the data burst from the buffer, the operational process to calculate a precise delivery time 120, first determines the number of read transfer buffer output bus bursts, at step 123. This is simply the multiplicative product of the read transfer buffer FIFO depth and the width. The width is defined as the number of DRAM data bursts that are loaded into the same FIFO slot on a given read transfer buffer input clock cycle. For example, if the input clock runs at the same frequency as the DRAM memory clock, then 2 double data rate bursts are loaded side by side in the same read transfer buffer slot. If said read transfer buffer contains 8 slots, then the total number of bursts equals 16. Conversely, if the input clock frequency is the DRAM data rate (i.e twice as fast as the DRAM memory clock), then each FIFO slot would contain a single data burst thereby making the total number of bursts equal to the number of FIFO slots.

Next at step 124, the operational process to calculate a precise delivery time 120 determines the cycle on which the data residing in the last buffer slot needs to be unloaded. In order to ensure proper asynchronous operation across the read transfer buffer clock domains, the operation 100 allows for a programmable amount of layover. Layover refers to the number of output bus clock cycles data must reside within the FIFO before it's considered stable enough to unload. This layover provides the necessary setup and hold margin to cover any uncertainty between the two clock domains due to factors such as clock skew, jitter, PLL static phase error and long term drift. Typically, 2 cycles of layover provide appropriate metastability protection, but under conditions of excessive long term jitter or phase error between the clock domains, 3 cycles may be desired. The operational process to calculate a precise delivery time 120 determines the unload cycle of the last data burst by the formula:

$$\text{last data burst unload cycle} = ((\text{fifo\_depth} - 1) * \text{gear\_ratio}) + 1 + \text{layover}$$

Thus, using an example of a read transfer buffer with 8 slots, a 3:1 gear ratio, and a typical layover of 2 cycles, the data in the last buffer slot must be delivered 24 cycles after the first cycle the FIFO begins to load. It should be noted that the burst being unloaded on this cycle is not always the last burst of DRAM data. For instance, in situations where each FIFO slot holds two bursts of DRAM data, this cycle denotes the point at which the second-to-last burst must be delivered on the bus.

At step 125, the operational process to calculate a precise delivery time 120 determines the intermediate burst field length. This is determined by subtracting twice the width from the total number of read transfer buffer output bursts. The intermediate burst field denotes the number of output bus cycles that it takes to transfer the FIFO contents held in all of the slots between the first and last slot. For example, in an 8 slot FIFO, this would be the number of bus cycles it takes to transfer all the contents in the second through seventh slots.

At step 125, the operational process to calculate a precise delivery time 120 calculates the number of initial idle cycles by subtracting the intermediate burst field length from step 124 from the unload cycle from step 123. The FIFO width is further subtracted from this result, and that result is further decremented by 1. In summary, the number of inital idles is determined by the formula:

$$\text{Initial idle cycles} = (\text{step 123 result}) - (\text{step 124 result}) - (\text{fifo\_width}) - 1$$

As soon as the first slot begins to load, operation 100 delays unloading Slot 0 until the number of initial idle cycles has transpired. At this point, it's safe to begin unloading each FIFO slot in succession and the each burst of data is guaranteed to have been loaded into the FIFO and remain intact for the required layover period.

In order to deliver said data seamlessly, the hierarchical buffer system 60 of the present invention incorporates an innovative aspect known as dual port loading. Traditional FIFOs employ a single write pointer to load the input data into the respective slots. With traditional pipelining, a read pointer will begin unloading the first slot while the write pointer continues loading subsequent slots. This reduces latency by overlapping the read and write operations. Depending on the gear ratio, slot 0 is often unloaded well before the write pointer completes the load operation. This means slot 0 is available to be reused for a second transaction. However, with a single write pointer, this availability can't be exploited as the FIFO must wait for the write pointer to wrap back to slot 0 before it can accept new data for a subsequent transaction.

The hierarchical buffer system 60 utilizes dual port loading which allows for the aggressive pipelining that is required to maintain seamless transfers with a minimum of interim idles. In order to achieve this, the initial overlap slot number is calculated at the same time as the initial idles at step 127. As with the initial idles, the step 124 result is subtracted from the Step 123 result and further decremented by 1. This interim result is divided by the gear ratio calculated in Step 122. The division is again an integer division. If the result has no remainder then the result is the target slot number. Otherwise, if there's a remainder, the result is incremented by one.

Thus the formula at step 127 is defined as:

step 127 result=((step 123 result)−(step 124 result)−1)/gear_ratio

If the result has a remainder, then the result is incremented by 1.

In the event there is data in one of the first tier buffers awaiting transfer to the read transfer buffer, then the result of step 127 indicates the target Slot where loading of said second transaction should begin using the second write pointer.

At step 128, that operational process to calculate a precise delivery time 120 the required spacing of subsequent data transfers to ensure seamless transfers. The following formula is used to calculate the minimum gap:

minimum gap=(((slot # from Step 127)*(gear_ratio))−(fifo_depth*fifo_width))+((layover−2)*(gear_ratio−1))

At step 131, a check is made to see if the resulting minimum gap is negative. If it is determined at step 131 that the resulting minimum gap is negative, then the operational process to calculate a precise delivery time 120 proceeds to step 133. However, if it is determined at step 131 that the resulting minimum gap is not negative (i.e. is positive), then the result represents the number of idle cycles that must be inserted between the last burst of the current transaction and the first burst of the next transaction. The operation 100 determines at step 132, that all subsequent transactions begin loading at a slot number determined in step 127. The operational process to calculate a precise delivery time 120 then skips the step 139.

At step 133, the operational process to calculate a precise delivery time 120 determines that no gap is required and the first burst of the subsequent transaction can be unloaded immediately after the last burst of the current transaction. If it is determined that subsequent transactions are to be transmitted seamlessly, then the slot number in step 127 indicates the slot number for the next transaction. However, the slot number may vary with subsequent transactions as shown in FIG. 5D (8 Slot-Double Wide-3:1 Gear). In these cases the unload pointer continually increments and wraps while the write pointers would continually alternate to load Slot 0 on the first available input bus clock cycle that Slot 0 becomes available. As shown in FIG. 5D, the overlap point will vary.

At step 139, the operational process to calculate a precise delivery time 120 then exits.

In an alternative embodiment, apparatus and method for computing the precise delivery time is described in commonly assigned and co-pending U.S. Patent Application entitled "Automatic Read Data Flow Control In A Cascade Interconnect Memory System", Ser. No. 12/166,226 filed on Jul. 1, 2008. It is understood that other means exist to establish a precise delivery time for an upstream data bus, and the present invention does not preclude the use of means beyond those described herein. One example of an alternate embodiment is the use of a field within the read command which dictates the required delivery time for the transaction. This approach allows a bus or memory controller to establish a particular flow control and bus utilization. Regardless of the method used to calculate the delivery time, and any associated read data buffer delay, the present invention contemplates the use of the establishment of a precise delivery time to control the movement of the data through the operation 100.

FIG. 4 is a table illustrating an example that explains the timing diagrams examples illustrated in FIG. 5A-F, and shows variables that drive the operation 100 according to one embodiment of the invention. The DQ Bytes 181, DDR Frequency 182, HSS UI 190, HSS Frequency 191 and HSS Bytes 192 columns are the "inputs" that would vary depending on how one would construct the memory stack of circuitry 44 (A-H) (FIG. 1B) as well as how it would connect to the processor 21/43. For example, the DDR Frequency 182 shows the DRAM speed in GHz. The last 4 speeds illustrated are DDR4 since this is the current state-of-the-art. The DQ Bytes 181 is how many data bytes each vault will transfer on its through silicon vias (TSV) 51 (FIG. 1B). The illustrated example show transfers of both 4 bytes and 8 bytes, because that's the typical interface to DRAMs.

On the right side are the variables associated with the high speed serial (HSS) link 59. The HSS Bytes 192 is the number of bytes transferred upstream on each HSS/Output Clock 189, and 2 bytes are used in all the examples for reasons of practical limitation. These high speed links are comprised of differential pairs, so 2 bytes is typically on the order of 50 HSS wires when the CRC protection across the 16 data channels is taken into account. Furthermore, extra wires are frequently afforded to serve as spare lanes, allow the interface to be electrically calibrated and to carry additional upstream status bits. Along with the number of HSS Bytes 192 is the HSS Frequency 191. The first 2 rows show a frequency of 9.6 GHz (or Gbps). The remaining rows are 10 GHz to show examples of other specifications. The last input variable is the HSS UI 190. This is the size of the parallel packet that the hierarchical buffer system 60 will accept and serialize onto one of the data channels. So HSS UI 190 set to 4 means that 4 bits are loaded into the hierarchical buffer system 60 in parallel, and those 4 bits will be serialized into one HSS link 59 at the HSS Frequency 191. This allows the output of the $2^{nd}$ tier transfer buffer 65 (and associated data path) in the hierarchical buffer system 60 to operate at ¼th the HSS frequency 191. The ratio of parallel to serial bits, also known as the HSS Unit Interval (UI) 190, is important because the HSS frequency 191 is typically much faster than the processor 21/43 logic. The HSS/Output Clock 189 column is simply the HSS Frequency 191 divided by the HSS UI 190. 4 UI are typically used for the HSS UI 190 in this example because most HSS designs are optimized to accept 4 parallel bits for each data channel.

The HSS UI 190 is important because it defines the size of each packet that the example 2nd stage read transfer buffer 65 (FIG. 2B) must deliver. For example, when using the spec of 2 HSS bytes running at 10 GHz with an HSS UI 190 of 8, means the $2^{nd}$ tier transfer buffer 65 has to deliver 8*2=16 bytes of data on a 1.25 GHz clock. The HSS UI 190 combined with the # of DQ Bytes 181 drives the design of the $2^{nd}$ stage transfer buffer 65.

Consider an example in which the $2^{nd}$ stage transfer buffer 65 is used to transfer 2 HSS Bytes 192 at 9.6 GHz upstream to the processor 21/43. In this example, the HSS UI 190 is 4, so the 2nd stage transfer buffer 65 has to output an 8 byte packet on a 2.4 GHz clock. The 8 bytes is the LL Bytes 188 column. LL stands for Link Layer which is the interface between the $2^{nd}$ tier read transfer buffer output data path in the hierarchical buffer system 60 and the HSS link 59 interface. Further consider a DRAM interface which transfers 8 bytes of data on each beat to the processor 21/43 from DDR DRAMs 44 (A-H) FIG. 1B running at 1.6 GHz. All the remaining columns in the table 140 are calculated based on the "input" columns. So the table 140 provides the design guidelines. If the minimum buffer width is "1" and data would flow into the hierarchical buffer system 60 at 1.6 GHz (same as the DRAM frequency). This means the input bandwidth of 12.8 GB/sec (8 bytes at 1.6 GHz) from the DRAM interface, and an output bandwidth of 19.2 GB/sec (8 LL Bytes at 2.4 GHz) to drive into the processor 21/43. Since the HSS BW 193 is greater than the DDR BW 184, then a positive gear ratio is provides. In this example, it's a ratio of 1.5.

The Minimum FIFO Width 185 column shows how many DQ bytes 181 need to be stored in a single slot of the $2^{nd}$ tier read transfer buffer 65 in the hierarchical buffer system 60 given the input variables. In the above example, the minimum is "1" because 8 bytes are retrieved from the DRAM 44(A-H) on each DRR Frequency 182 (i.e. 1.6 GHz clock cycle). Since 8 bytes are to be unloaded, the size matches so the stream of each incoming 8-byte beat of DQ Bytes 181 into a new $2^{nd}$ tier read data transfer buffers 65 in the hierarchical buffer system 60. At the appropriate time, the $2^{nd}$ tier read transfer buffer can begin unloading the 8-byte beats to drive the HSS link 59. In this example, the minimum width is 1 because the $2^{nd}$ tier read data transfer buffer input clock for the $2^{nd}$ tier transfer buffers 65 in the hierarchical buffer system 60 is assumed to be the DRAM clock frequency (1.6 GHz). However, in some embodiments, the memory controller within the vault issuing read commands to the hierarchical buffer system 60 operates at half that frequency because the DRAM command interface operates at a DDR/2 frequency. However, power savings is an important consideration in virtually every consumer product in today's market. So, the Inp Clk 183 column is run at 0.8 GHz. to reduce power consumption. This means the $2^{nd}$ tier read data transfer buffers 65 in the hierarchical buffer system 60 has to be 2 to capture two 8-byte DQ beats from memory into the $1^{st}$ tier data buffers 61 or fast path staging register 62 on every 0.8 GHz cycle. Thus, in this example the minimum FIFO width 185 for the $2^{nd}$ tier read data transfer buffer 65 would need to be 2. So, the 2 beats are held and this is achieved by making the $2^{nd}$ tier transfer buffers 65 in the hierarchical buffer system 60 twice as wide. But when the $2^{nd}$ tier transfer buffers 65 in the hierarchical buffer system 60 is unloaded, 1 beat is unloaded at a time.

FIGS. 5A-F are timing diagrams depicting examples is of the operation of a hierarchical buffer system 60 according to one embodiment of the invention. The title of each timing diagram FIGS. 5A-F indicates the number of slots (i.e. 0-3 or 0-7), how wide it is (i.e. either single or double wide which refers to the number in the Minimum FIFO Width 185 (FIG. 4) and the Gear Ratio 186 (FIG. 4). The write pointers (WPTR1 (i.e. 201, 221, 241, 261, 281 and 301) and WPTR2 (i.e. 202, 222, 242, 262, 282 and 302) operate at the Inp Clk 183 Frequency and the bus clock (i.e. 204, 224, 244, 264, 284 and 304) at the bottom of the timing diagram is the HSS/Output Clock 189 column. Each beat of Output Bus (i.e. 205, 225, 245, 265, 285 and 305) at the bottom of the timing diagram has to be LL Bytes 188 wide. The last thing is the $2^{nd}$ tier transfer buffers 65 Depth. The timing diagrams examples depict two types of timing diagrams, both 4 and 8 slots deep. This is based on how the hierarchical buffer system 60 would communicate with the processor 21/43 and is typically tied to the cache line size the processor 21/43 prefers. For example, cache lines typically require the transfer of 64 byte frames. This works out well because the DDR3 and DDR4 DRAMs typically return 8 beats of data with each read access. Each beat is 8 bytes wide (i.e. DQ Bytes 181 in the table 140), which totals 64 bytes of read data. Referring to the 2nd row of the table 140, if the example FIFO operates at 1.6 GHz and uses the Minimum FIFO Width 185 of 1, then an 8-deep $2^{nd}$ tier transfer buffers 65 in the hierarchical buffer system 60 is needed. However, if a FIFO is needed to interfaces with the same 1.6 GHz memory, but operates with an input clock frequency of 0.8 GHz to conserve power, and uses the Minimum FIFO Width 185 of 2, then the $2^{nd}$ tier transfer buffers 65 depth only needs to be 4 in order to hold all 64 bytes.

To implement the hierarchical buffer system 60 using the 2nd row of the table 140 (FIG. 4) for a 64 byte cache line, an 8 deep single wide $2^{nd}$ tier transfer buffers 65 in the hierarchical buffer system 60 is used with an input clock of 1.6 GHz, and output clock is 2.4 GHz. The output bus of the FIFO would transfer 8 bytes of data on each 2.4 GHz cycle into an HSS core that would serialize the 8 bytes into 2 bytes at 9.6 GHz. This gives a working Gear Ratio of 1.5. This is all the info needed to plug into operational process to calculate a precise delivery time 120 in order to know exactly which cycle to begin loading the FIFO, how many initial idle cycles are needed prior to starting the unload, and how many idle cycle need to be inserted between successive reads to ensure gapless transfers at this ratio. Finally, it indicates how the two write pointers need to overlap to maintain the transfer rate.

Although the 2nd row was used as the example, all the remaining rows work the same way. The remaining rows show a sample of the more popular DDR frequencies couples with a HSS frequency of 10 GHz which is the current state of the art. It should be obvious to one skilled in the art that as the DDR and HSS frequencies increase in the future, the method described herein can be used to determine the optimum gear ratio for a given FIFO structure.

In FIGS. 5A thru 5F timing diagrams are employed to illustrate several speed matching scenarios for various configurations of a $2^{nd}$ tier read transfer The Minimum FIFO Width 185 (from table 140) multiplied by the depth of the FIFO determines the total number of beats. The Output Bus (i.e. 205, 225, 245, 265, 285 and 302) at the bottom of the timing diagram shows each beat being delivered from the $2^{nd}$ tier read transfer buffer 65 to the HSS link 59. Each of these ovals has a byte width defined by the LL Bytes 188 column.

Also illustrated in each timing diagram FIGS. 5A-F are bars trailing the data in each slot. Those are occupancy indicators. Referring to FIG. 5A Slot 0 211, it shows beat 0 being loaded into Slot 0 on the first cycle. For the next 4 cycles, there's a long bar which represents the time the data must remain undisturbed until it is safely transferred onto the output bus. Once that time expires, the slot can either be re-loaded with new data or it can be empty awaiting new data. This indicates why the write pointers need to overlap the way they do. A key innovation in the hierarchical buffer system 60 of the present invention, is the dual write pointers. Without them, the buffer would have two wait for the write pointer to completely finish loading data for one word and wrap back to 0 before it can begin loading the next transaction. This can be seen in FIG. 5A, the 8 Slot Single Wide 2:1 Gear, by looking at the use of WPTR2 202 to begin reloading Slot 0 while WPTR1 201 is still writing Slot 5. Without the dual load capability, this would require an additional 3 idle cycles between the first and second transfers. Said differently, a traditional FIFO design with a single write pointer would incur a 30% latency impact on a continuous read stream compared to our invention.

FIGS. 5A-F are timing diagrams depicting examples is of the operation of a hierarchical buffer system 60 according to one embodiment of the invention.

Illustrated in FIG. 5A, is an example timing diagrams for an eight slot-single wide-2:1 gear. In this example, the output of the $2^{nd}$ tier read data transfer buffer is running twice as fast as the input side. The timing diagram begins by immediately initiating the loading of Slot 0 211 on the input clock 203 cycle. The loading of each subsequent Slot 1 212 thru Slot 7

218 continues for the next 4 input clock 203 cycles. As per the method described in FIG. 3B, the first transaction requires 9 initial idles for this FIFO configuration. More idles could be inserted, but that would unnecessarily delay the return of the first data burst to the HSS link 59. However, any attempt to begin unloading the FIFO prior to the 9 initial idle cycles would either result in violating the 2 cycle layover requirement and risking a transient error through the asynchronous boundary or it would force gaps between the output data bursts. Neither situation is desirable. On the $10^{th}$ output clock 204 cycle, the data burst held in Slot 0 is read out of the $2^{nd}$ tier read transfer buffer and transmitted to the HSS link 59. The remaining data bursts can be safely read out on successive cycles without fear of underruning the FIFO or violating the asynchronous layover requirement. This ensures a seamless gapless transfer of all the data beats on output bus 205. In addition, it can also be seen that WPTR 2 202 is employed to begin reloading Slot 0 with a second read transaction while WPTR 1 201 is still completing the first read transaction. Again, the method in FIG. 3B determines that this reload can begin as soon as WPTR 1 201 gets to Slot 5. This results in a minimum gap of 2 output clock 204 cycles between the last data burst of the first read and the first data burst of the next read As shown in the timing diagram, Slot 0 remains occupied until WPTR 1 201 arrives at Slot 5. That happens to be the earliest time Slot 0 can be reused.

Illustrated in FIG. 5B, is an example timing diagram for an eight slot-single wide-3:1 gear. This timing diagram is nearly identical to FIG. 5A except the output bus clock 224 is running 3 times faster than the input bus clock 223. It is intended to demonstrate the need for more initial idle cycles and a larger minimum gap between subsequent data transfers to compensate for the greater mismatch in clock frequencies.

Illustrated in FIG. 5C, is an example timing diagram for a four slot-double wide-3:1 gear. FIG. 5C demonstrates a scenario where 3 vaults 80 (A-C) feed data to a single HSS link 59 utilizing a 4 slot double-wide $2^{nd}$ tier buffer and a load/unload gear ratio of 3:1. In this example, 3 read transactions are processed though the hierarchical buffer system 60. The first read is targeted to vault 80A utilizing an unused HSS link 59 followed by 2 additional operations from vaults 80B and 80C. Since the HSS link 59 and $2^{nd}$ tier transfer buffer 65 are unused, the operation from vault 80A will be able to use the vaults 80A fast path staging register 62, illustrated as VT A FP 255 in FIG. 5C, to immediately load the $2^{nd}$ tier transfer buffer 65 once data is returned. In this example, the gear ratio used and Minimum FIFO Width 185 requires an idle_delay+layover time of 5 unload clock cycles to ensure the gapless data transfer out of the $2^{nd}$ tier transfer buffer 65 to the HSS link 59. This delay is spent entirely in the $2^{nd}$ tier transfer buffer 65 for the vault 80A transaction.

Since the HSS link 59 will be busy when vault 80B's data is returned, its data cannot immediately be moved into the $2^{nd}$ tier transfer buffer 65 as it is occupied with vault 80A's data. Vault 80B's data is assigned a read data buffer delay of 14 cycles; 5 minimum for idle/layover+9 additional cycles to account for channel useage. Vault 80B's data is held in the vault 80B's $1^{st}$ tier data buffer 61 for 9 cycles before a slot becomes available in the 2nd tier transfer buffer 65. This is illustrated as VT B B0 S0-S3 (246-249) in FIG. 5C. As soon as a slot in the $2^{nd}$ tier transfer buffer 65 becomes available, the transfer to the $2^{nd}$ tier transfer buffer 65 is initiated and the vault 80B data is moved to the $2^{nd}$ tier transfer buffer 65. Note that this transaction occurs while vault 80A's final bursts are also being loaded to the $2^{nd}$ tier transfer buffer 65. Vault 80B's data will load on the $2^{nd}$ tier transfer buffer 65 second input port, avoiding any data collision. The vault 80B data will spend it's remaining 5 cycles of buffer delay in the $2^{nd}$ tier transfer buffer 65 before being transmitted to the HSS link 59.

Vault 80C transaction follows a similar path as vault 80B's. Since the HSS link 59 is busy when vault 80C's data is returned it is assigned an read data buffer delay value of 20 cycles (5 idle/layover+15 additional). This is illustrated as VT C B0 S0-S3 (256-259) in FIG. 5C. Again, as soon as the slot in the $2^{nd}$ tier transfer buffer 65 becomes usable, the data is moved to the slot in the $2^{nd}$ tier transfer buffer 65 using the $2^{nd}$ load port of the $2^{nd}$ tier transfer buffer 65 and the remaining delay is accumulated in the $2^{nd}$ tier transfer buffer 65 before the data is released to the HSS link 59.

Illustrated in FIG. 5D is an example timing diagrams for an eight slot-double wide-3:1 gear. In this scenario in which subsequent data transfers can occur in a truly seamless fashion without any intervening gaps. This is possible because the $2^{nd}$ tier read data transfer buffer is a double wide FIFO which means each slot holds 2 bursts of output data. Combined with the 8 slot depth, once the FIFO has been sufficiently primed with enough input data, it's possible to keep the output bus 265 constantly fed. Although the 9 initial ides are necessary to prime the buffer, the present invention permits the remaining read transactions to transmit on consecutive cycles by dynamically overlapping WPTR 1 261 with WPTR 2 262. This illustrates a situation where Step 131 of FIG. 3B resulted in a negative gap thereby allowing the the FIFO to be loaded and unloaded as fast as possible thereby creating maximum throughput.

Illustrated in FIG. 5E is an example timing diagrams for a four slot-double wide-4:1 gear. This scenario is nearly identical to FIG. 5C with the only difference being the increased initial idles and minimum gap width due to the higher gear ratio (4:1 as opposed to 3:1 in FIG. 5C).

Illustrated in FIG. 5F is an example timing diagrams for an eight slot-double wide-4:1 gear. This scenario is nearly identical to FIG. 5D, however the faster 4:1 gear ratio resulted in Step 131 of FIG. 3B being positive and thereby requiring a minimum gap of 4 cycles between subsequent data transfers.

Any process descriptions or blocks in flow charts should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

While the invention has been described with reference to preferred and example embodiments, it will be understood by those skilled in the art that a variety of modifications, additions and deletions are within the scope of the invention, as defined by the following claims.

What is claimed is:

1. A method of controlling data entries in a hierarchical buffer system for a plurality of memory sources, the method comprising:
managing buffers to move multiple data packets from a plurality of $1^{st}$ tier hardware buffers into a $2^{nd}$ tier hardware transfer buffer;
calculating precise delivery times for the multiple data packets in the $2^{nd}$ tier hardware transfer buffer to minimize gap in a data transfer;
enabling the $2^{nd}$ tier hardware transfer buffer to serve as an asynchronous boundary to permit data to cross a plurality of clock domains running at different frequencies; and
delivering the data in the $2^{nd}$ tier hardware transfer buffer onto an upstream data bus, and wherein said multiple data packets are delivered at the calculated precise delivery times.

2. The method of claim 1, further comprising:
using a first operational frequency of a memory interface along with a second operational frequency of a high speed upstream data bus to form a gear ratio which is used with a size of the memory interface, a size of the high speed interface, the asynchronous boundary set up, hold margin, width and depth of said $2^{nd}$ tier hardware transfer buffer for purposes of calculating of the precise delivery times.

3. The method of claim 1, further comprising:
using a read data buffer delay for retaining data in the 1st tier hardware buffers until the multiple data packets can be moved from the $1^{st}$ tier hardware buffers to the $2^{nd}$ tier hardware transfer buffer, and from the $2^{nd}$ tier hardware transfer buffer onto the upstream data bus.

4. The method of claim 3, further comprising:
moving multiple data packets to the $2^{nd}$ tier hardware transfer buffer passively upon expiration of the read data buffer delay.

5. The method of claim 3, further comprising:
moving multiple data packets to the $2^{nd}$ tier hardware transfer buffer actively once a slot is available in the $2^{nd}$ tier hardware transfer buffer.

6. The method of claim 1, wherein the $2^{nd}$ tier hardware transfer buffer can operate as a traditional First-In-First-Out buffer, and enables the $2^{nd}$ tier hardware transfer buffer to act as a staging register, and wherein the $2^{nd}$ tier hardware transfer buffer provides simultaneous loading of the multiple data packets for purposes of delivering the multiple data packets comprising a plurality of data transfer lengths with minimum latency.

7. The method of claim 1, further comprising:
a plurality of gear ratios for the purpose of interfacing a plurality of memory components with a fixed frequency high speed upstream data bus.

8. The method of claim 7, further comprising:
inserting idle gaps in a beginning of a data transmission to provide a continuous data stream while maintaining a high data transfer rate.

9. The method of claim 7, further comprising:
returning buffered multiple data packets from multiple transactions in a seamless pattern with a minimum of idle gaps inserted.

10. The method of claim 1, further comprising:
fast pathing multiple data packets to minimize latency when the upstream data bus is available and no buffering is required.

11. The method of claim 1, further comprising:
injecting a poison data pattern on a data frame boundary for purposes of alerting a memory controller to enact system recovery policies.

12. An integrated circuit device comprising:
a memory core;
a high speed upstream data bus;
a plurality of $1^{st}$ tier hardware buffers that receive multiple data packets from the memory;
a $2^{nd}$ tier hardware transfer buffer spanning a plurality of asynchronous timing domains that delivers the multiple data packets onto the upstream data bus to minimize gaps in a data transfer; and
a plurality of read data buffer delay buffers for retaining data in the $1^{st}$ tier hardware buffers until such time the multiple data packets can be moved from the 1st tier hardware buffers to the $2^{nd}$ tier hardware transfer buffer and from the $2^{nd}$ tier hardware transfer buffer onto the upstream data bus, wherein the plurality of read data buffer delay buffers calculate precise delivery times for the multiple data packets in the $1^{st}$ tier hardware buffers using a first operational frequency of the memory core and a second operational frequency of the upstream data bus, the data bus widths of the memory core and the upstream data bus along with the $2^{nd}$ tier hardware transfer buffer width and depth.

13. The integrated circuit device of claim 12, wherein the data in the a plurality of $1^{st}$ tier hardware buffers is moved to the $2^{nd}$ tier hardware transfer buffer passively upon expiration of the read data buffer delay and once a slot is available in the $2^{nd}$ tier hardware transfer buffer.

14. The integrated circuit device of claim 12, wherein the $2^{nd}$ tier hardware transfer buffer can operate as a traditional First-In-First-Out buffer, and enables the $2^{nd}$ tier hardware transfer buffer to act as a staging register, and wherein the $2^{nd}$ tier hardware transfer buffer provides simultaneous loading of the multiple data packets for purposes of delivering the multiple data packets comprising a plurality of data transfer lengths with minimum latency.

15. The integrated circuit device of claim 12, further comprising:
a plurality of gear ratios for the purpose of interfacing a plurality of memory components with a fixed frequency high speed upstream data bus, wherein at least one of the plurality of gear ratios inserts idle gaps in a returning data stream to provide necessary speed matching while maintaining a preferred data transfer rate.

16. A processor device comprising:
a memory core containing multiple data packets;
a high speed upstream data bus;
circuitry configured to:
managing buffers to move multiple data packets from a plurality of 1st tier hardware buffers through a 2nd tier hardware transfer buffer spanning a plurality of asynchronous timing domains;
delivering the multiple data packets from the 2nd tier hardware transfer buffer onto the high speed upstream data bus to minimize gaps in a data transfer; and
a plurality of read data buffer delay buffers for retaining multiple data packets in the 1st tier hardware buffers until such time the data can be moved from the 1st tier hardware buffers to the 2nd tier hardware transfer buffer and from the 2nd tier hardware transfer buffer onto the upstream data bus, wherein the plurality of read data buffer delay buffers use computations based on operational frequencies of the memory core and the upstream data bus in conjunction with data bus widths of said memory core and upstream data bus along with the 2nd tier hardware transfer buffer width and depth for calculating precise delivery times for the multiple data packets in the 1st tier hardware buffers and further allowing for appropriate set up and hold margin for an asynchronous boundary within the 2nd tier hardware transfer buffer.

17. The processor device of claim 16, wherein the 2nd tier hardware transfer buffer can operate as a traditional First-In-First-Out buffer, and enables the 2nd tier hardware transfer buffer to act as a staging register, and wherein the 2nd tier hardware transfer buffer provides simultaneous loading of the multiple data packets for purposes of delivering the multiple data packets comprising a plurality of data transfer lengths with minimum latency.

18. The processor device of claim 16, further comprising:
a plurality of gear ratios for the purpose of interfacing a plurality of memory components with a fixed frequency high speed upstream data bus, wherein at least one of the plurality of gear ratios inserts idle gaps in a returning data stream to provide necessary speed matching while maintaining a data transfer rate.

\* \* \* \* \*